US011716853B2

(12) United States Patent
Wu et al.

(10) Patent No.: US 11,716,853 B2
(45) Date of Patent: Aug. 1, 2023

(54) METHOD FOR FABRICATING THREE-DIMENSIONAL MEMORY DEVICE BY THICKENING AN EPITAXIAL LAYER

(71) Applicant: Yangtze Memory Technologies Co., Ltd., Wuhan (CN)

(72) Inventors: Linchun Wu, Wuhan (CN); Kun Zhang, Wuhan (CN); Wenxi Zhou, Wuhan (CN); Zhiliang Xia, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 215 days.

(21) Appl. No.: 16/895,410

(22) Filed: Jun. 8, 2020

(65) Prior Publication Data

US 2021/0296325 A1 Sep. 23, 2021

Related U.S. Application Data

(63) Continuation of application No. PCT/CN2020/080316, filed on Mar. 20, 2020.

(51) Int. Cl.
*H10B 43/35* (2023.01)
*H10B 43/10* (2023.01)
*H10B 43/27* (2023.01)

(52) U.S. Cl.
CPC ............ *H10B 43/35* (2023.02); *H10B 43/10* (2023.02); *H10B 43/27* (2023.02)

(58) Field of Classification Search
CPC ........... H01L 27/115–11597; H10B 12/00–50; H10B 69/00; H10B 53/00; H10B 53/10; H10B 53/20; H10B 53/30; H10B 53/40–44; H10B 53/46–50; H10B 41/00; H10B 41/10; H10B 41/20; H10B 41/23;
(Continued)

(56) References Cited

U.S. PATENT DOCUMENTS

| 2011/0002178 A1* | 1/2011 | Hwang ............. H01L 21/28518 257/314 |
| 2015/0076586 A1 | 3/2015 | Rabkin et al. |

(Continued)

FOREIGN PATENT DOCUMENTS

| CN | 105355602 A | 2/2016 |
| CN | 110676258 A | 1/2020 |

(Continued)

*Primary Examiner* — Didarul A Mazumder
*Assistant Examiner* — Gustavo G Ramallo
(74) *Attorney, Agent, or Firm* — Anova Law Group, PLLC

(57) ABSTRACT

Three-dimensional (3D) NAND memory devices and methods are provided. In one aspect, a fabrication method includes depositing a cover layer over a substrate, depositing a sacrificial layer over the cover layer, depositing a layer stack over the sacrificial layer, forming a channel layer extending through the layer stack and the sacrificial layer, performing a first epitaxial growth to deposit a first epitaxial layer on a side portion of the channel layer that is close to the substrate, removing the cover layer, and performing a second epitaxial growth to simultaneously thicken the first epitaxial layer and deposit a second epitaxial layer on the substrate. The layer stack includes first stack layers and second stack layers that are alternately stacked.

15 Claims, 21 Drawing Sheets

(58) Field of Classification Search
CPC ........ H10B 41/27; H10B 41/30; H10B 41/35; H10B 41/40; H10B 41/50; H10B 51/00; H10B 51/10; H10B 51/20; H10B 51/30; H10B 51/40; H10B 51/50
See application file for complete search history.

(56) References Cited

U.S. PATENT DOCUMENTS

| | | | |
|---|---|---|---|
| 2016/0111432 A1 | 4/2016 | Rabkin et al. | |
| 2018/0006052 A1* | 1/2018 | Hwang | H01L 21/76879 |
| 2018/0102375 A1 | 4/2018 | Pang et al. | |

FOREIGN PATENT DOCUMENTS

| | | |
|---|---|---|
| CN | 110752214 A | 2/2020 |
| CN | 111276490 A | 6/2020 |
| TW | 201939718 A | 10/2019 |

* cited by examiner

US 11,716,853 B2

METHOD FOR FABRICATING THREE-DIMENSIONAL MEMORY DEVICE BY THICKENING AN EPITAXIAL LAYER

CROSS-REFERENCE TO RELATED APPLICATION

This application is a continuation of International Application No. PCT/CN2020/080316, filed on Mar. 20, 2020, the entire content of which is incorporated herein by reference.

FIELD OF THE TECHNOLOGY

This application relates to the field of semiconductor technology and, specifically, to a three-dimensional (3D) semiconductor memory device and fabrication method thereof.

BACKGROUND OF THE DISCLOSURE

The growing demands of consumer electronics, cloud, and big data bring about a constant need of NAND memories of larger capacity and better performance. As conventional two-dimensional (2D) NAND memory approaches its physical limits, three-dimensional (3D) NAND memory is now playing an important role. 3D NAND memory uses multiple stack layers in a single chip to achieve higher density, higher capacity, faster performance, lower power consumption, and better cost efficiency.

During the fabrication of a 3D NAND memory device, an opening for gate line slit (GLS) is etched and a cavity above the substrate is formed. Then selective epitaxial growth of single crystalline silicon and polysilicon is performed on the bottom surface and sidewalls of the cavity simultaneously and respectively. As the epitaxial growth on the bottom surface is faster than that on the sidewalls, the growth on the sidewalls is affected and becomes incomplete, resulting in incomplete filling of polysilicon in some places of the memory device.

SUMMARY

In one aspect of the present disclosure, a fabrication method for a three-dimensional (3D) NAND memory device includes depositing a cover layer over a substrate, depositing a sacrificial layer over the cover layer, depositing a layer stack over the sacrificial layer, forming a channel layer extending through the layer stack and the sacrificial layer, performing a first epitaxial growth to deposit a first epitaxial layer on a side portion of the channel layer that is close to the substrate, removing the cover layer, and performing a second epitaxial growth to simultaneously thicken the first epitaxial layer and deposit a second epitaxial layer on the substrate. The layer stack includes first stack layers and second stack layers that are alternately stacked.

In another aspect of the present disclosure, another fabrication method for a 3D NAND memory device includes depositing a sacrificial layer over a substrate, depositing a layer stack over the sacrificial layer, forming a channel layer extending through the layer stack and the sacrificial layer, forming a cover layer to shield the substrate, performing a first epitaxial growth to deposit a first epitaxial layer on a side portion of the channel layer that is close to the substrate, removing the cover layer, and performing a second epitaxial growth to simultaneously thicken the first epitaxial layer and deposit a second epitaxial layer on the substrate. The layer stack includes first stack layers and second stack layers that are alternately stacked in a direction approximately perpendicular to the substrate.

In another aspect of the present disclosure, a 3D NAND memory device includes a substrate, a first epitaxial layer over the substrate, a layer stack over the first epitaxial layer, a channel layer extending through the layer stack, a second epitaxial layer on a side portion of the channel layer that is close to the substrate, and an electrically conductive layer isolated from and surrounding the second epitaxial layer. The layer stack includes conductor layers and dielectric layers alternately stacked in a direction approximately perpendicular to the substrate.

Other aspects of the present disclosure can be understood by those skilled in the art in light of the description, the claims, and the drawings of the present disclosure.

DETAILED DESCRIPTION

The following describes the technical solutions in the embodiments of the present disclosure with reference to the accompanying drawings. Wherever possible, the same reference numbers will be used throughout the drawings to refer to the same or like parts. Apparently, the described embodiments are merely some but not all the embodiments of the present disclosure. Features in various embodiments may be exchanged and/or combined. Other embodiments obtained by a person skilled in the art based on the embodiments of the present disclosure without creative efforts shall fall within the scope of the present disclosure.

Figure 1:
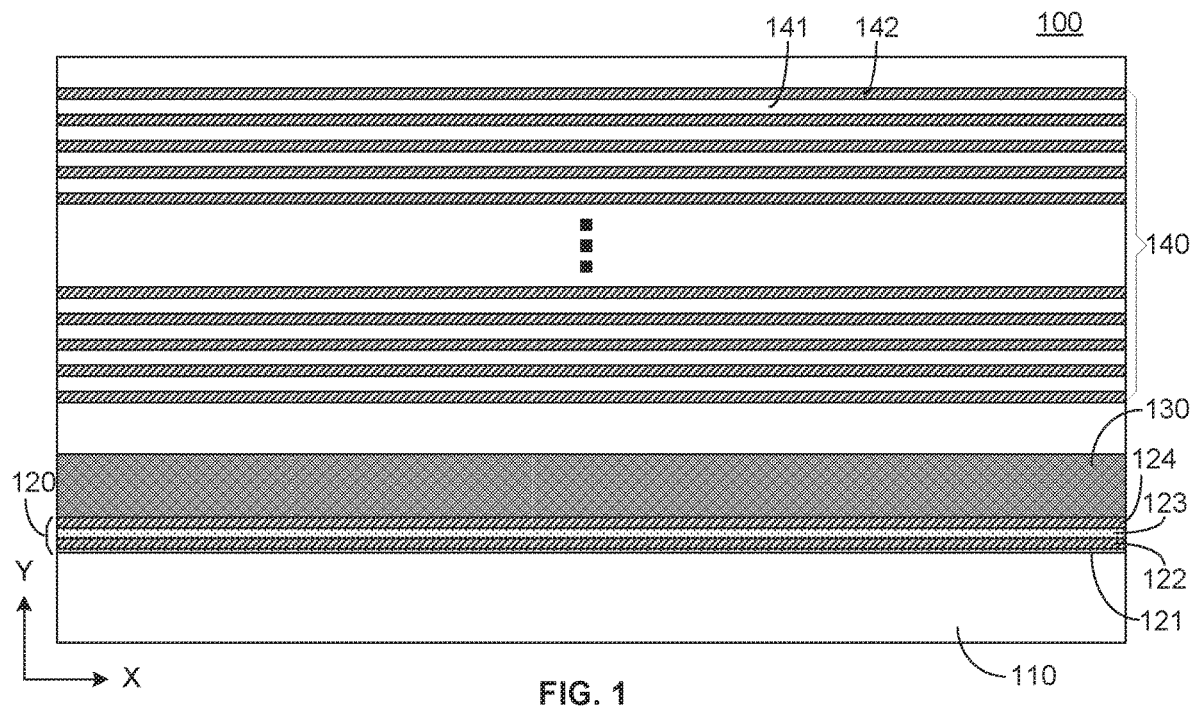
FIG. 1 illustrates schematically a cross-sectional view of a three-dimensional (3D) memory device in an exemplary fabrication process according to embodiments of the present disclosure.

FIGS. 1-21 schematically show a fabrication process of an example 3D memory device 100 according to embodiments of the present disclosure. Among FIGS. 1-21, cross-sectional views are in the X-Y plane and top views are in the X-Z plane. As shown in FIG. 1, the 3D memory device 100 includes a substrate 110. In some embodiments, the substrate 110 may include a single crystalline silicon layer. In some other embodiments, the substrate 110 may include another semiconductor material such as germanium, gallium arsenide, indium phosphide, polycrystalline silicon (polysilicon), etc. In some other embodiments, the substrate 110 may include an electrically non-conductive material such as glass, a plastic material, or a ceramic material. In the following descriptions, as an example, the substrate 110 includes an undoped or light doped single crystalline silicon layer. In some other embodiments, the substrate 110 may be doped differently with p-type or n-type dopants. When the substrate 110 includes glass, plastic, or ceramic material, the substrate 110 may further include a thin layer of polysilicon deposited on the glass, plastic, or ceramic material, such that the substrate 110 may be processed like a polysilicon substrate.

As shown in FIG. 1, a cover layer 120 is deposited over the substrate 110. The cover layer 120 includes layers 121, 122, 123, and 124 deposited in a direction perpendicular to a top surface of the substrate 110. The layers 121, 122, 123, and 124 may be dielectric and include silicon oxide, silicon nitride, silicon oxide, and silicon nitride, respectively. The layers 121-124 may be sequentially deposited by chemical vapor deposition (CVD), physical vapor deposition (PVD), atomic layer deposition (ALD), or a combination of two or more of these methods. In some other embodiments, the layers 121-124 may include different materials. In addition, in some other embodiments, a single layer, instead of four layers, may be formed on the substrate 110 and used as the cover layer, which will be discussed later.

Over a top surface of the layer 124, a sacrificial layer 130 is deposited. The sacrificial layer 130 may include a dielectric material, a semiconductive material, or a conductive material. In the discussions below, as an example, the layer 130 is a polysilicon layer, which may be deposited by a CVD and/or PVD process. After the polysilicon layer 130 is formed, a layer stack 140 is deposited. The layer stack 140 includes multiple pairs of stack layers 141 and 142, i.e., the layers 141 and 142 may be stacked alternately. In some embodiments, the layers 141 and 142 may include a first dielectric material and a second dielectric material that is different from the first dielectric material, respectively. The alternating layers 141 and 142 may be deposited via CVD, PVD, ALD, or a combination of two or more of these processes. In discussions bellow, exemplary materials for the layer 141 and 142 are silicon oxide and silicon nitride, respectively. In some other embodiments, different materials may be used to form the alternating layers 141 and 142. For example, the layers 141 and 142 may include dielectric materials other than silicon oxide and/or silicon nitride. Further, in some other embodiments, the layers 141 and 142 may include a dielectric layer and a conductive layer. The conductive layer may include, e.g., tungsten (W), cobalt (Co), copper (Cu), aluminum (Al), doped silicon, or silicide. In discussions below, as an example, the layers 141 and 142 include silicon oxide and silicon nitride, respectively.

Figure 2:
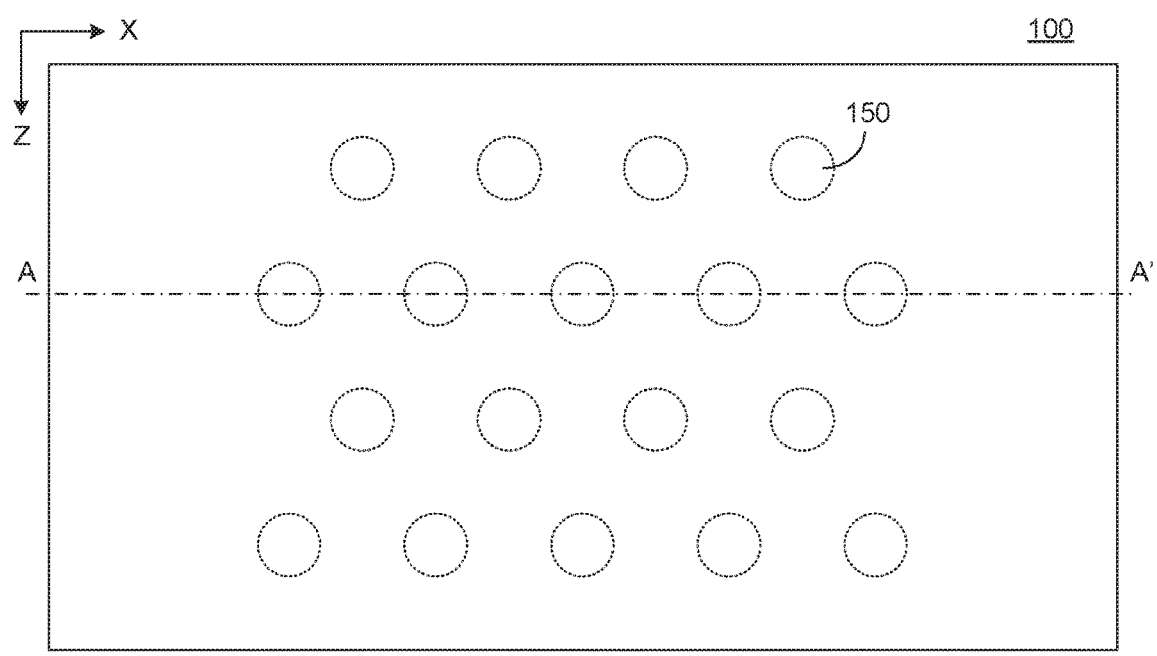
FIGS. 2 and 3 illustrate schematically a top view and a cross-sectional view of the 3D memory device shown in FIG. 1 after channel holes are formed according to embodiments of the present disclosure.
Figure 3:
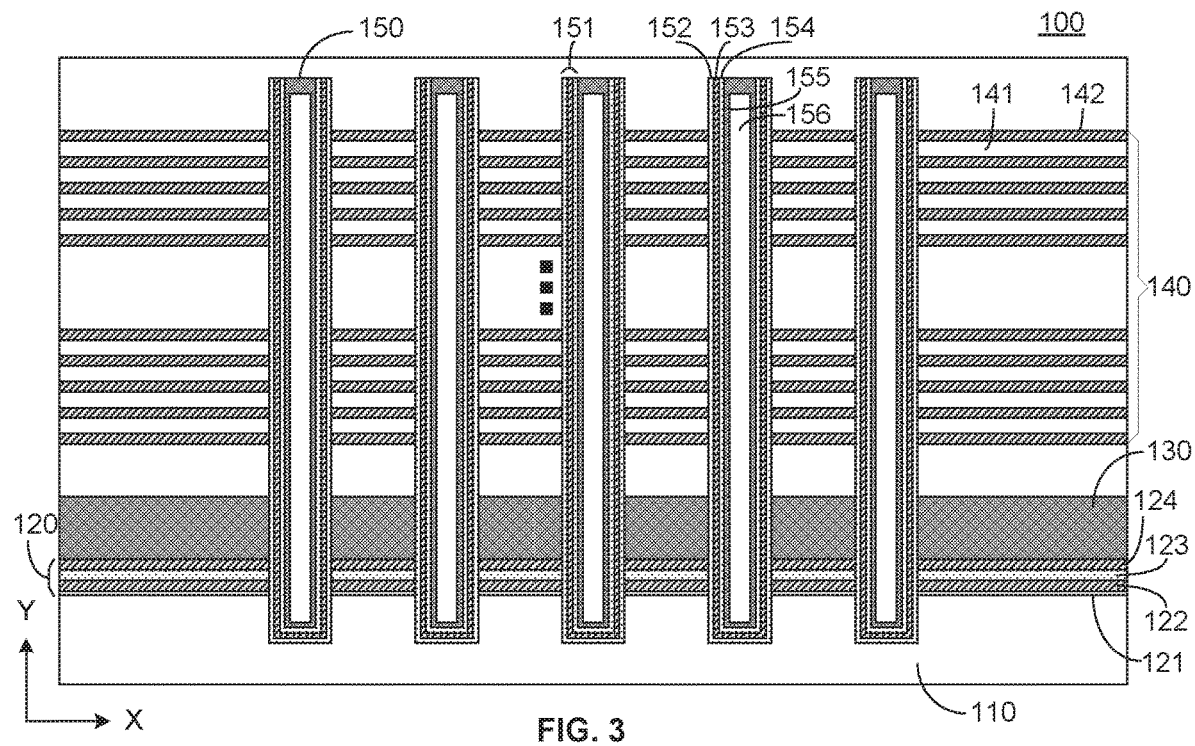

FIGS. 2 and 3 schematically show a top view and a cross-sectional view of the 3D memory device 100 after channel holes 150 are formed and filled according to embodiments of the present disclosure. The quantity, dimensions, and arrangement of the channels 150 shown in the figures are exemplary and for description of structures and fabrication methods of the device 100 only. The channel holes 150 are configured to extend in the Y direction and form a pattern in the X-Z plane. The cross-sectional view shown in FIG. 3 is taken along a line AA' of FIG. 2. Thus, FIG. 3 only illustrates some of the channels holes 150 of FIG. 2 that are in the cross section in the X-Y plane.

The channel holes 150 may be formed by, e.g., a dry etch process or a combination of dry and wet etch processes. Other fabrication processes may also be performed, such as a patterning process involving lithography, cleaning, and/or chemical mechanical polishing (CMP), while detailed descriptions of these processes are omitted for simplicity. The channel holes 150 may have a cylinder shape or pillar shape that extends through the layer stack 140 and the layers 130 and 121-124, and partially penetrates the substrate 110. After the channel hole 150 are formed, a functional layer 151 may be deposited on the sidewall of the channel hole. The functional layer 151 may include a blocking layer 152 on the sidewall of the channel hole to block an outflow of charges, a storage layer 153 on a surface of the blocking layer 152 to store charges during an operation of the 3D memory device 100, and a tunnel insulation layer 154 on a surface of the storage layer 153. The blocking layer 152 may include silicon oxide or a high-k dielectric material such as aluminum oxide or hafnium oxide. The storage layer 153 may include polysilicon, silicon nitride, silicon oxynitride, or nanocrystalline silicon. The tunnel insulation layer 154 may include silicon oxide or a high-k dielectric material such as aluminum oxide or hafnium oxide. In some embodiments, the functional layer 151 may include an oxide-nitride-oxide (ONO) structure. In some other embodiments, the functional layer 151 may include a structure other than the ONO structure. In the following descriptions, a composite layer including a silicon oxide layer, a silicon nitride layer, and a silicon oxide layer as the blocking layer 152, the storage layer 153, and the tunnel insulation layer 154, respectively, is described as an example of the functional layer 151.

As shown in FIG. 3, a silicon oxide layer may be deposited on the sidewall of the channel hole 150 as the blocking layer 152. A silicon nitride layer may be deposited on the blocking layer 152 as the storage layer 153 or a charge trap layer. Another silicon oxide layer may be deposited on the storage layer 153 as the tunnel insulation layer 154. On the tunnel insulation layer 154, a polysilicon layer is deposited as a channel layer 155, also referred to as a "semiconductor channel." In some other embodiments, the channel layer 155 (semiconductor channel) may include amorphous silicon. Like the channel holes, the channel layers 155 (semiconductor channels) also extend through the layer stack 140 and into the substrate 110. A portion of each functional layer 151 is configured between a portion of one of the stack layers 141 and 142 and a portion of one of the channel layers 155. The blocking layer 152, the storage layer 153, the tunnel insulation layer 154, and the channel layer 155 may be deposited by, e.g., CVD, PVD, ALD, or a combination of two or more of these processes. The channel holes 150 may be filled by an oxide material 156 after the channel layers 155 are formed.

Figure 4:
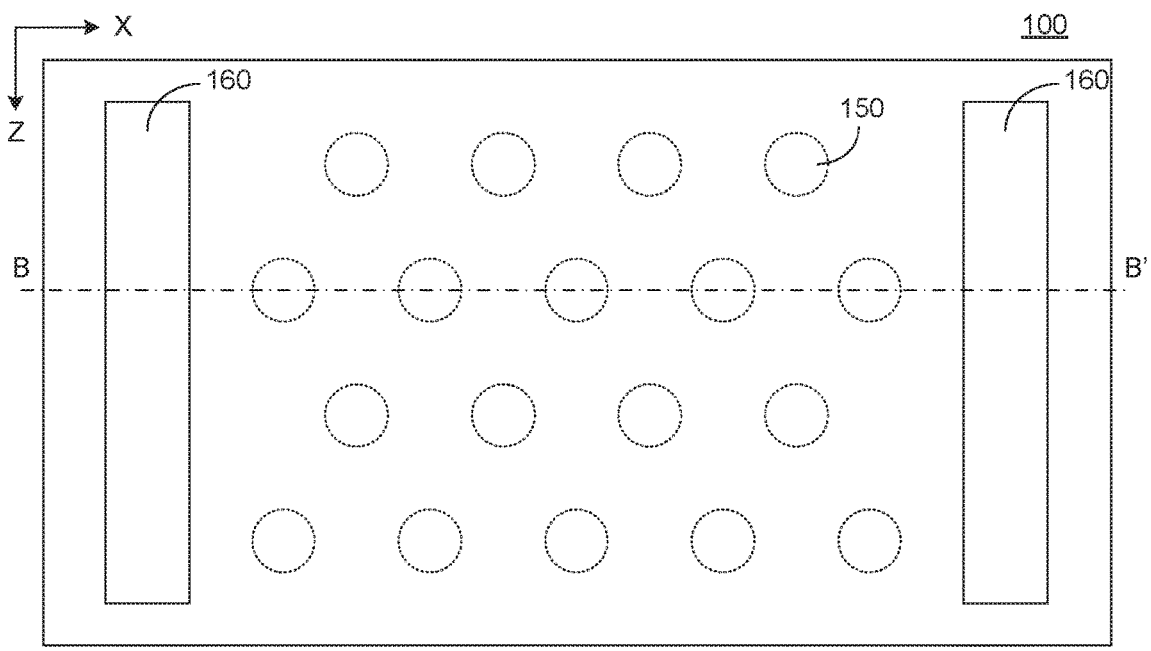
FIGS. 4 and 5 illustrate schematically a top view and a cross-sectional view of the 3D memory device shown in FIGS. 2 and 3 after gate line slit (GLS) is formed in according to embodiments of the present disclosure.
Figure 5:
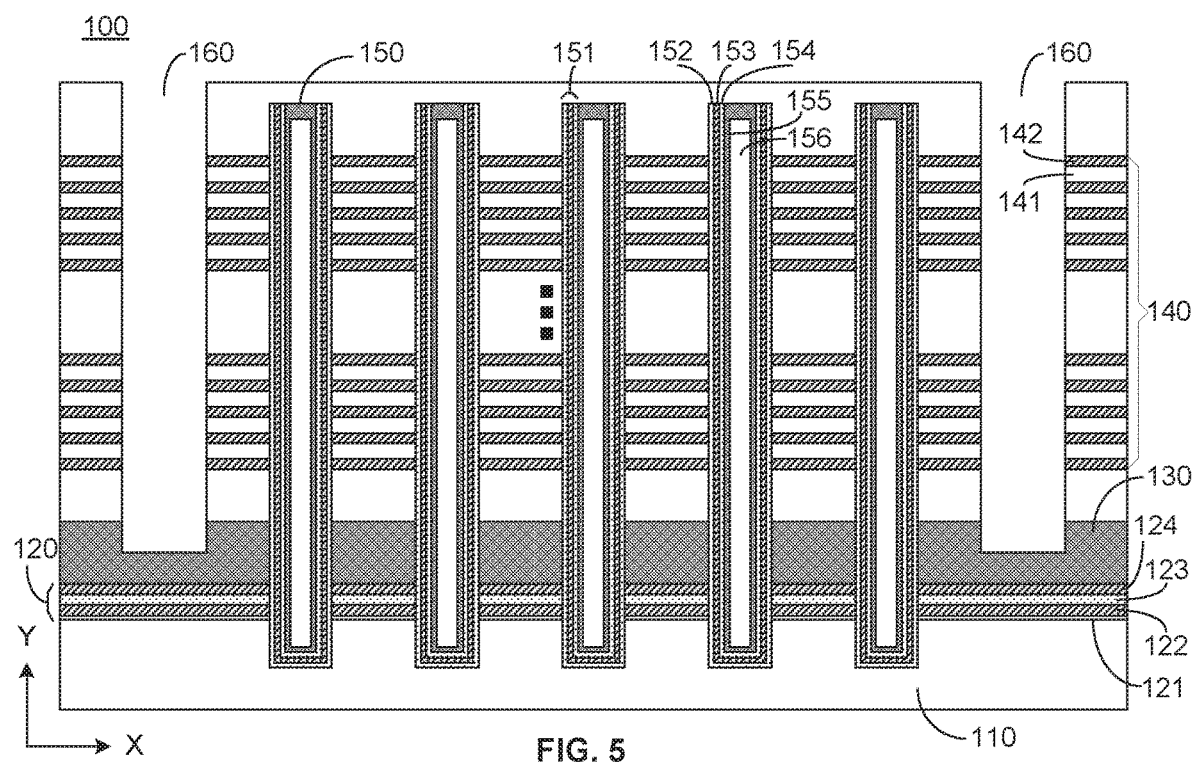

FIGS. 4 and 5 schematically show a top view and a cross-sectional view of the 3D memory device 100 after gate line slits (GLS's) 160 are formed according to embodiments of the present disclosure. The cross-sectional view shown in FIG. 5 is taken along a line BB' of FIG. 4. The GLS 160 may be formed by, e.g., a dry etch process or a combination of dry and wet etch processes. The GLS 160 extends through the layer stack 140 and extends partially in the polysilicon layer 130. As such, at the bottom of the GLS 160, a part of the polysilicon layer 130 is exposed.

Figure 6:
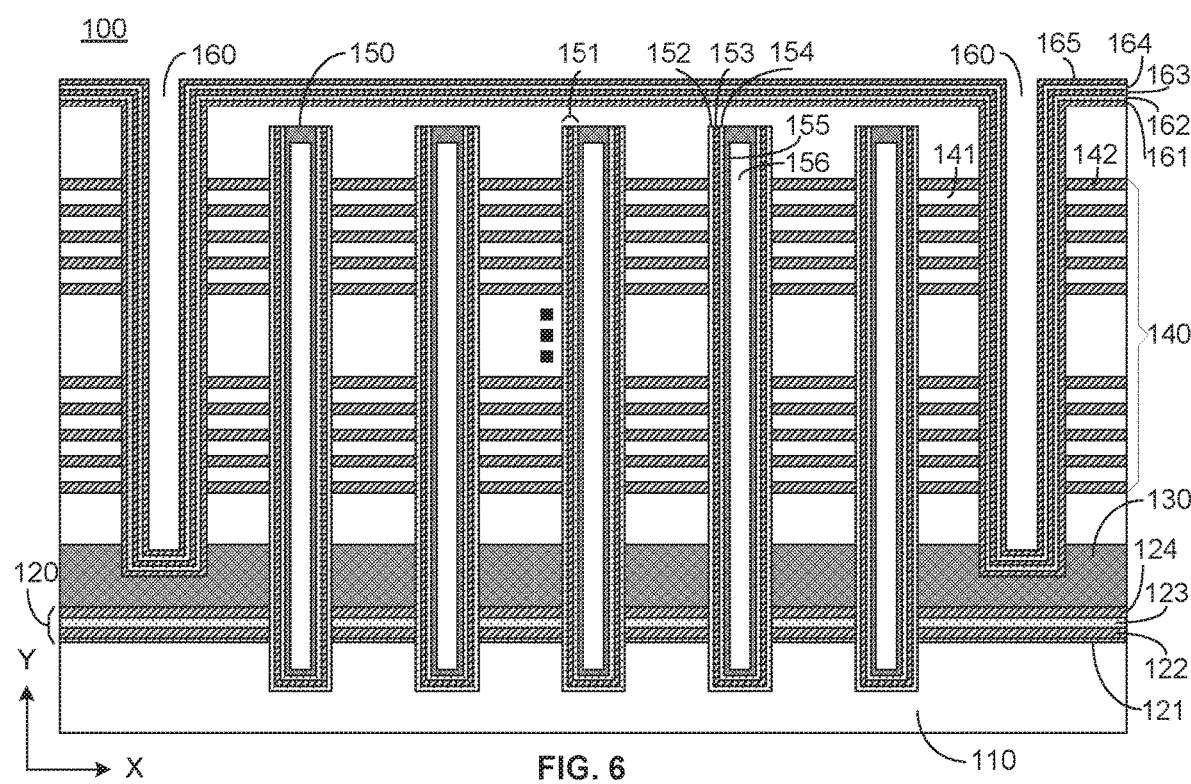
FIGS. 6 and 7 illustrate schematically cross-sectional views of the 3D memory device shown in FIGS. 4 and 5 after GLS spacers are deposited and then etched selectively according to embodiments of the present disclosure.
Figure 7:
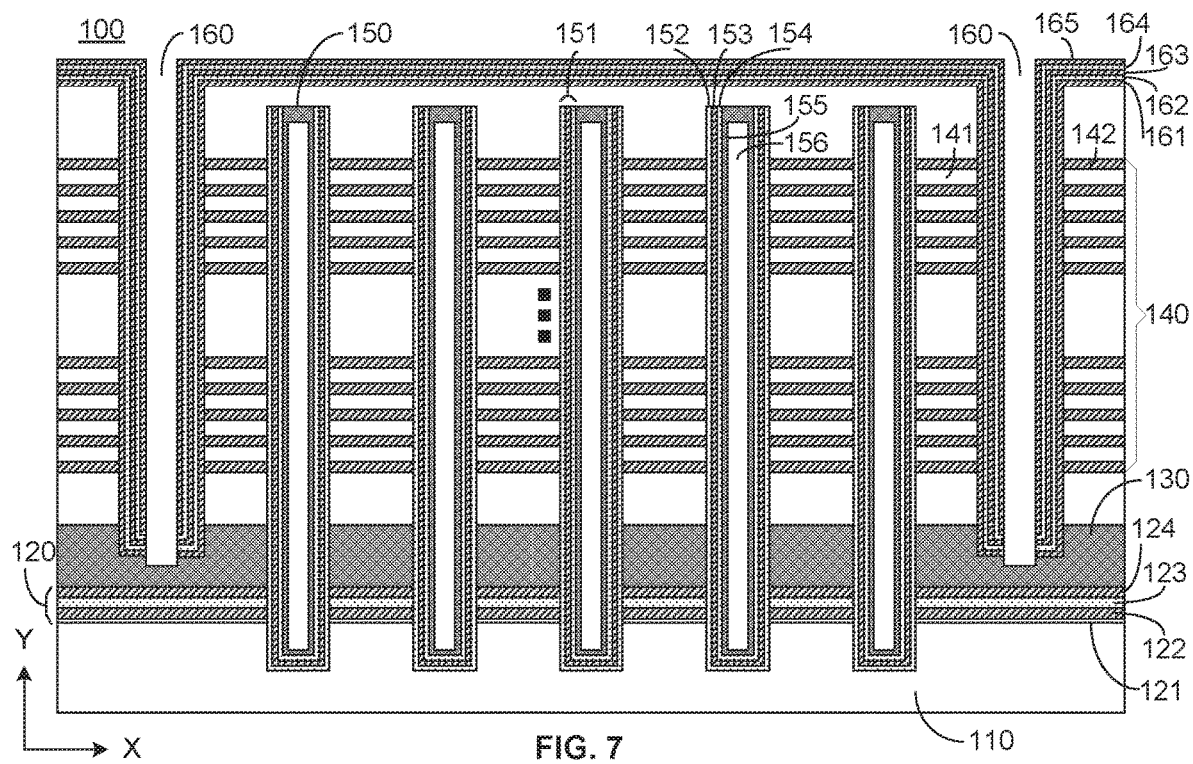

FIGS. 6 and 7 schematically show cross-sectional views of the 3D memory device 100 after GLS spacers are deposited and then selectively etched according to embodiments of the present disclosure. As shown in FIGS. 6 and 7, the GLS spacers include layers 161, 162, 163, 164, and 165 that may be deposited sequentially by CVD, PVD, ALD, or a combination of two or more of these processes. The layers 161, 163, and 165 may include silicon nitride and the layers 162 and 164 may include silicon oxide. In some embodiments, the layer 162 is configured sufficiently thicker than the layer 121, as shown schematically in FIG. 6. After the GLS spacers are deposited, selective etching is performed such that a part of the spacers at the bottom of the GLS is removed by dry etch or a combination of dry etch and wet etch. As such, the polysilicon layer 130 is partially exposed at the bottom of the GLS, as shown in FIG. 7.

Figure 8:
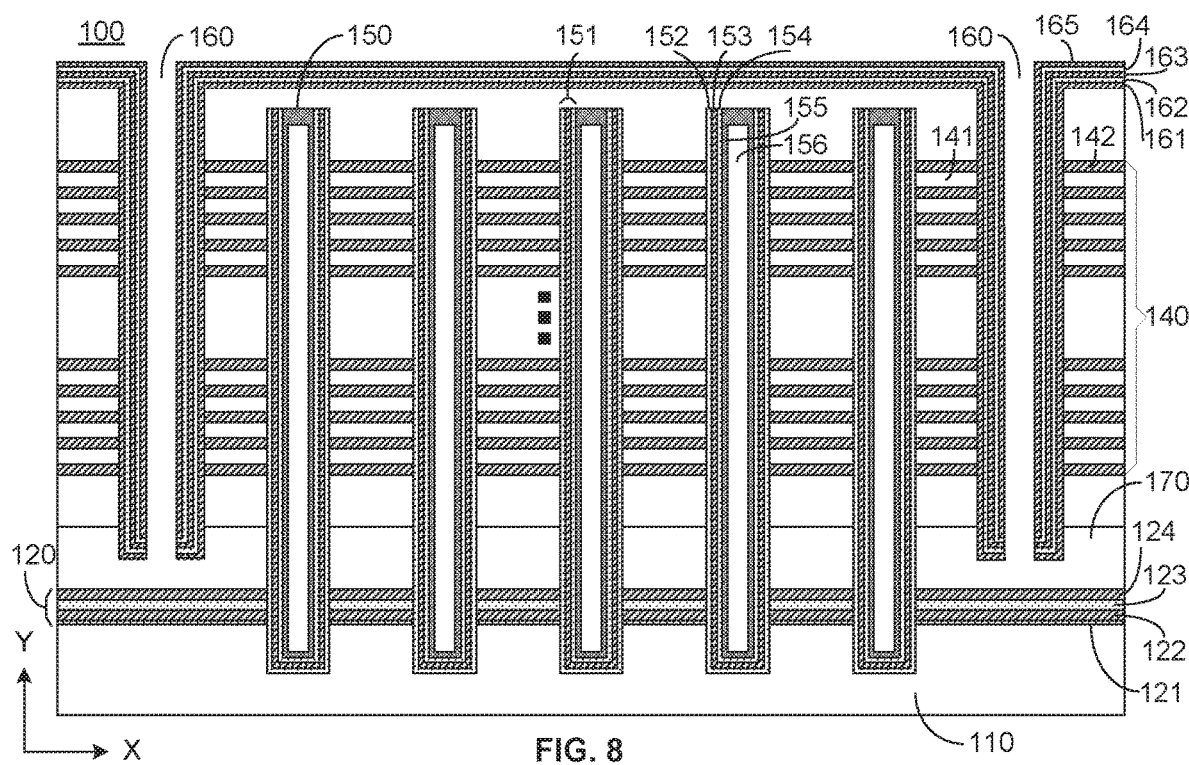
FIGS. 8-12 illustrate schematically cross-sectional views of the 3D memory device shown in FIG. 7 after certain etching steps are performed according to embodiments of the present disclosure.

FIGS. 8-12 each schematically show a cross-sectional view of the 3D memory device 100 after one or more etching steps are performed according to embodiments of the present disclosure. A first selective etch process, e.g., a selective wet etch process, is performed to remove polysilicon materials of the polysilicon layer 130. As illustrated in FIG. 8, removal of the polysilicon materials creates a cavity 170, exposing the silicon nitride layer 124 and bottom portions of the silicon oxide layers (i.e., the blocking layers 152) of the above-described functional layers 151 formed in the channel holes 150.

Figure 9:
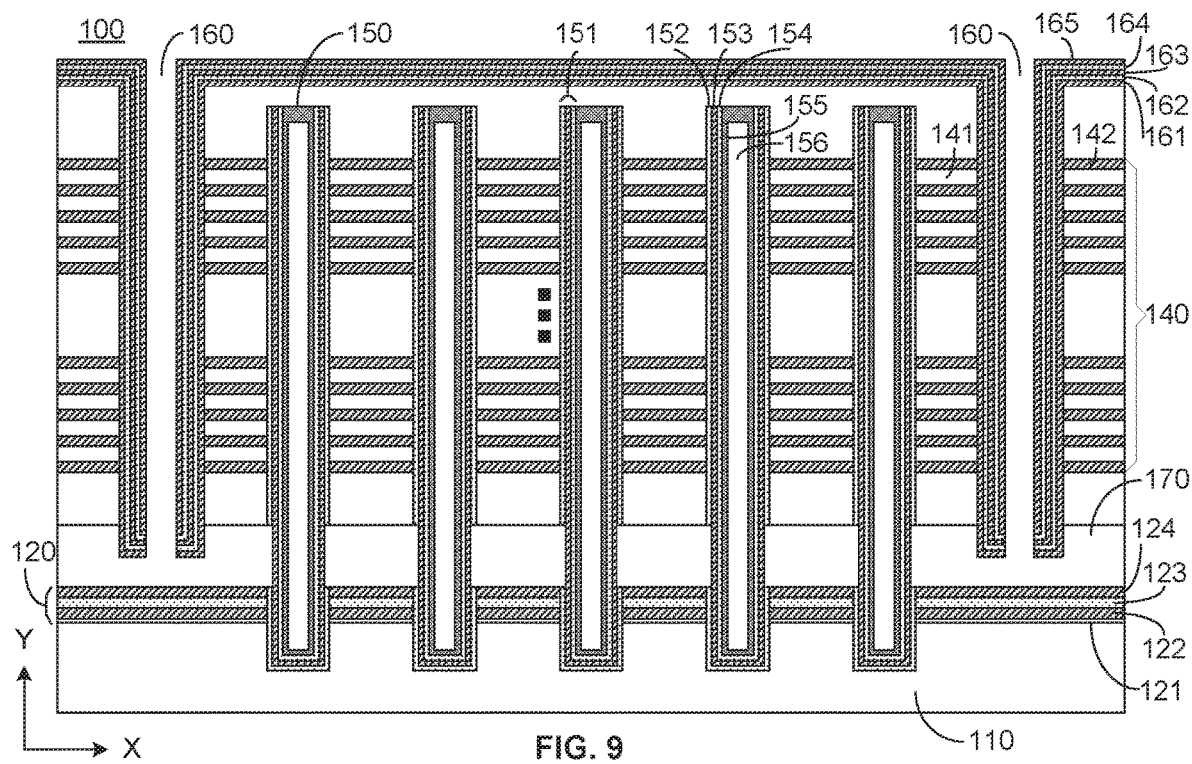

After the polysilicon layer 130 is etched, a second selective etch process, e.g., a selective wet etch process, is performed to remove parts of the silicon oxide layer of the functional layer 151 that are exposed in the cavity 170. As a result, portions of the silicon nitride layers (i.e., the storage layers 153) of the functional layers 151 are exposed, as shown in FIG. 9.

Figure 10:
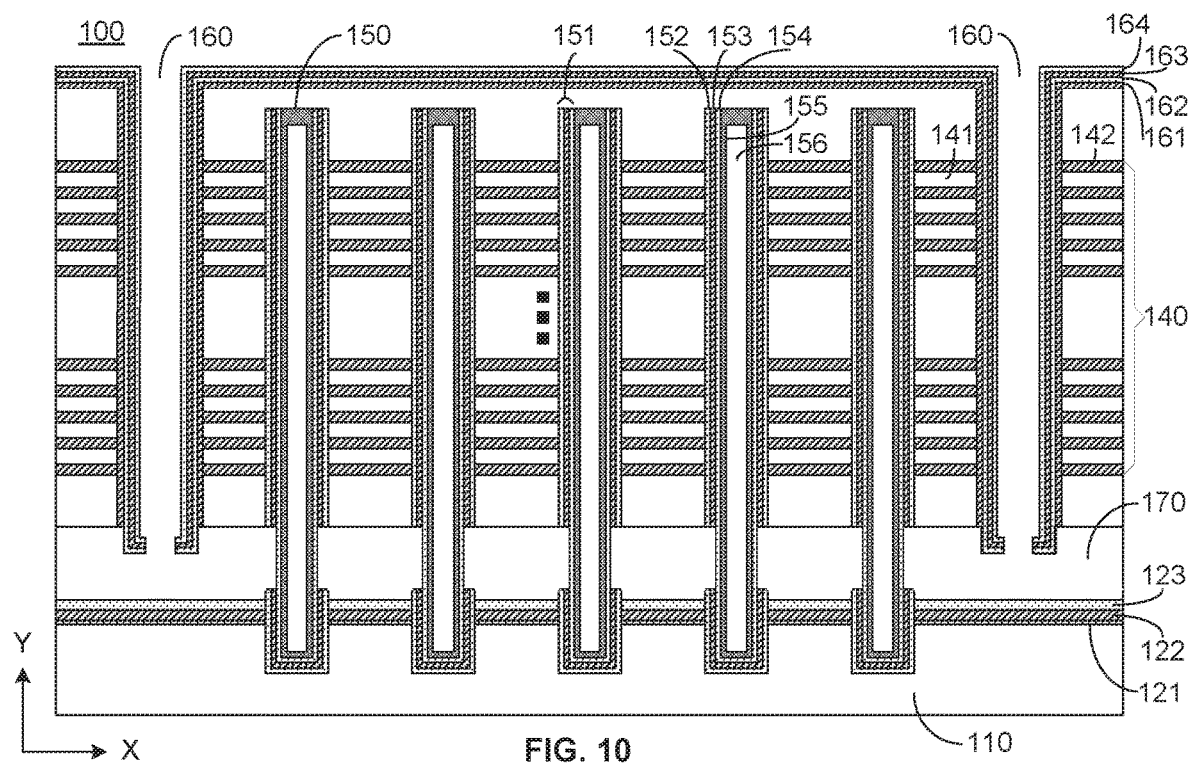

After the portions of the silicon nitride storage layers 153 are exposed, a third selective etch process, e.g., a selective wet etch process, is performed to remove exposed silicon nitride materials, including the exposed portions of the silicon nitride storage layers 153, and the layers 124 and 165. Removal of the exposed silicon nitride materials exposes portions of the silicon oxide layer (i.e., the tunnel insulation layer 154) of the functional layer 151 in the cavity 170, the silicon oxide layer 123 at the bottom of the cavity 170, and the silicon oxide layer 164 of the GLS spacers, as shown in FIG. 10.

Figure 11:
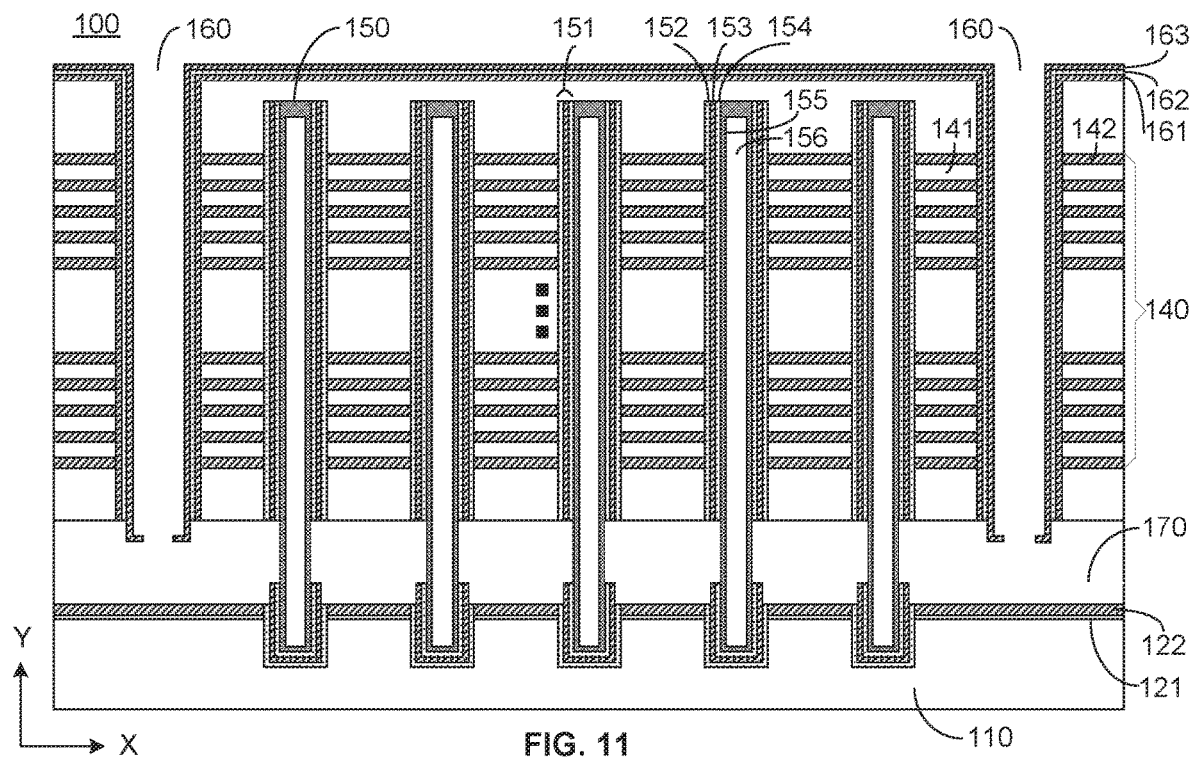

Then, a fourth selective etch process, e.g., a selective wet etch process is performed to remove exposed silicon oxide materials, including the exposed portions of the silicon oxide tunnel insulation layer 154, and the layers 123 and 164. Removal of the exposed silicon oxide materials exposes portions of the polysilicon layer (i.e., the channel layer 155) in the channel holes 150 in the cavity 170, the silicon nitride layer 122 at the bottom of the cavity 170, and the silicon nitride layer 163 of the GLS spacers, as shown in FIG. 11.

Figure 12:
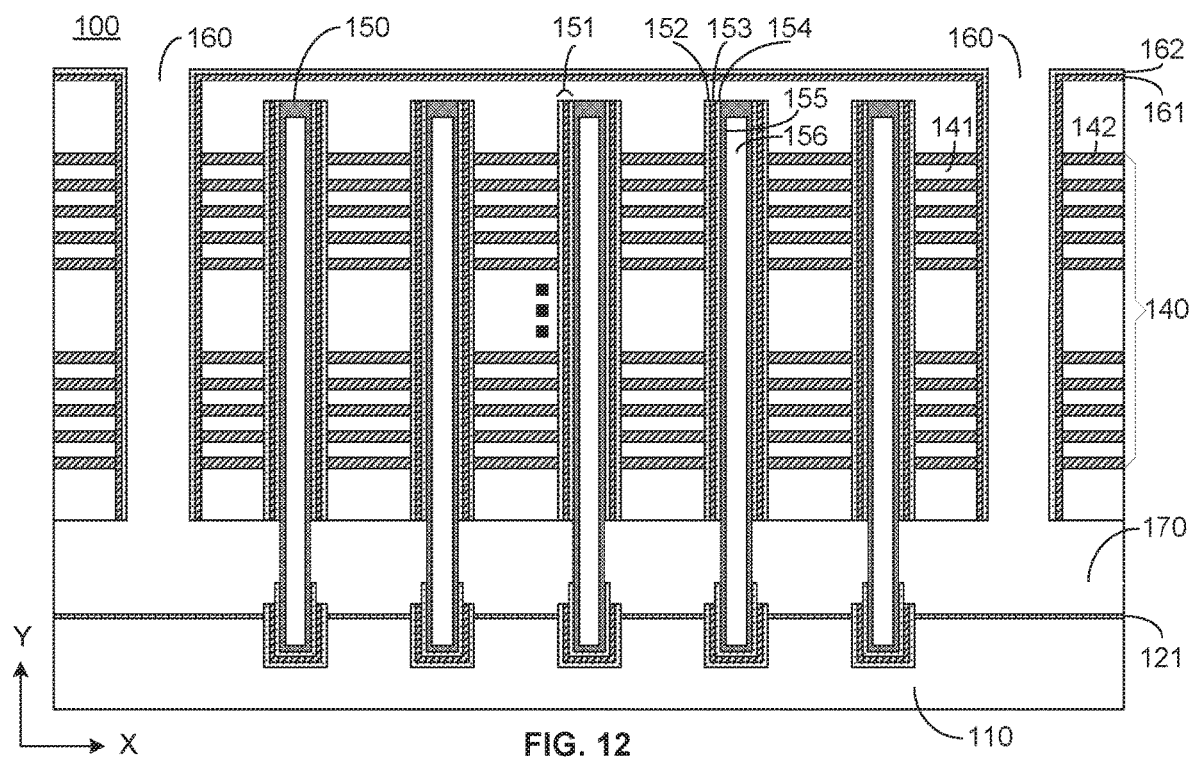

Next, a fifth selective etch process, e.g., a selective wet etch process, is performed to remove exposed silicon nitride materials, including the layers 122 and 163. Removal of the exposed silicon nitride materials exposes the silicon oxide layer 121 at the bottom of the cavity 170 and the silicon oxide layer 162 of the GLS spacers, as shown in FIG. 12. As a result, the portions of the polysilicon channel layers 155 close to the bottom of the channel holes 150 are exposed while other parts of the 3D memory device 100, including the silicon substrate 110, are covered by silicon oxide materials. The exposed portions of the polysilicon channel layers 155 are also the sidewalls of the cavity 170.

Figure 13:
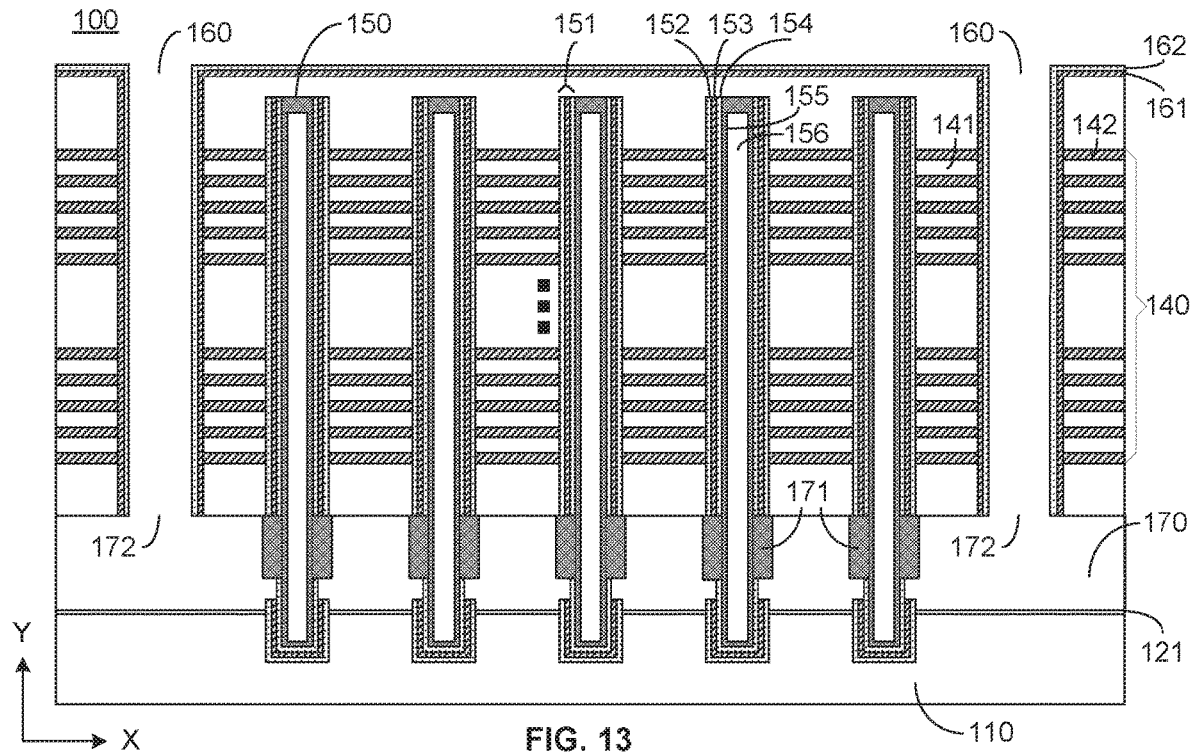
FIG. 13 illustrates schematically a cross-sectional view of the 3D memory device shown in FIG. 12 after selective epitaxial growth on sidewalls according to embodiments of the present disclosure.
Figure 14:
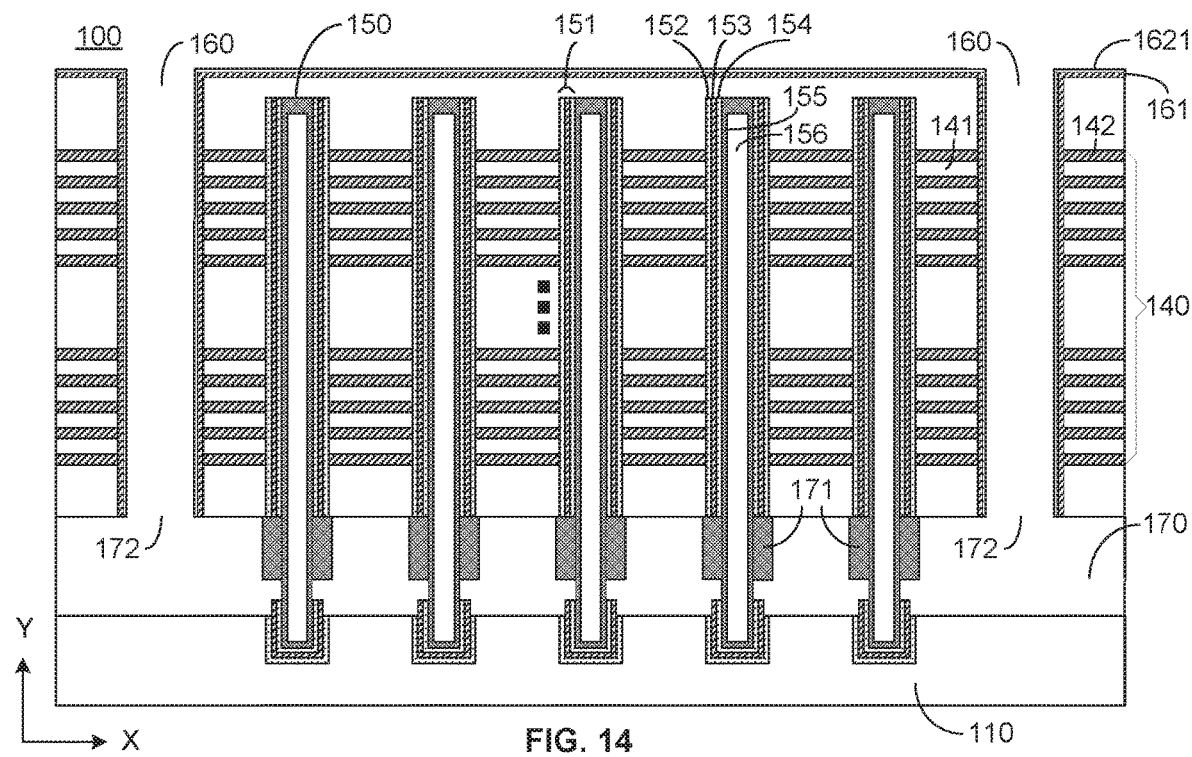
FIG. 14 illustrates schematically a cross-sectional view of the 3D memory device shown in FIG. 13 after an oxide layer is etched on a bottom surface according to embodiments of the present disclosure.
Figure 15:
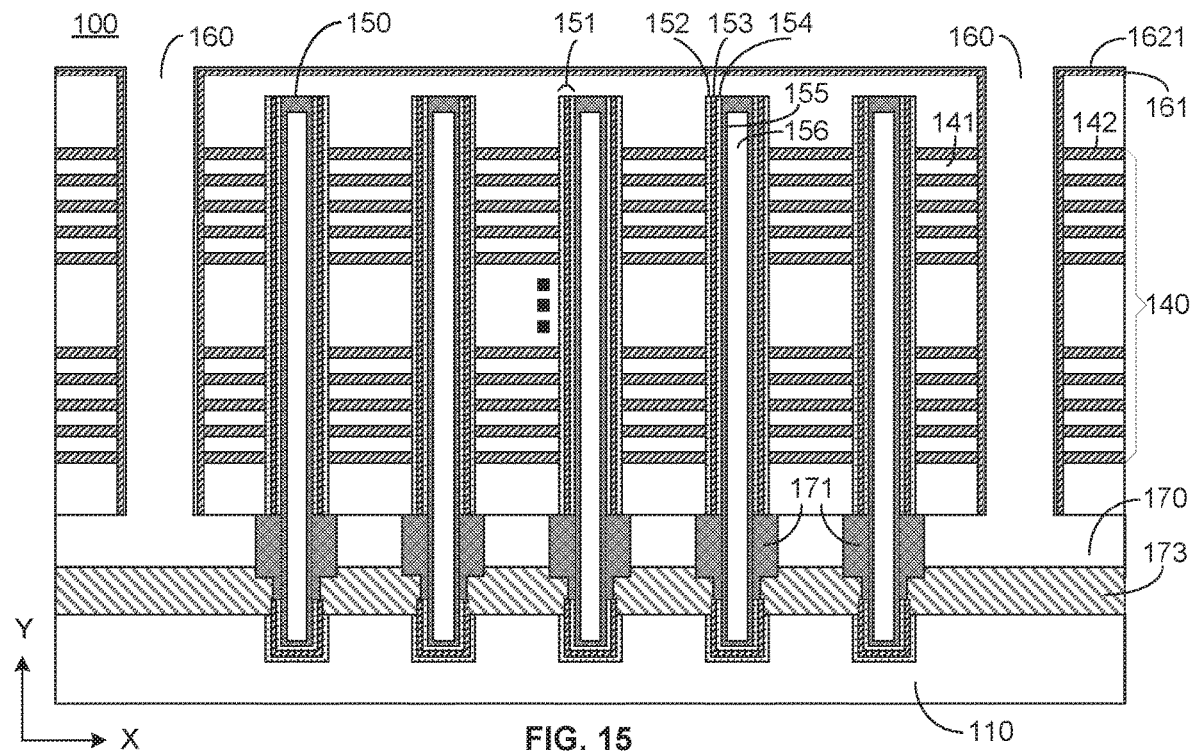
FIG. 15 illustrates schematically a cross-sectional view of the 3D memory device shown in FIG. 14 after selective epitaxial growth on both sidewalls and the bottom surface according to embodiments of the present disclosure.

FIGS. 13-15 schematically show cross-sectional views of the 3D memory device 100 after a first selective epitaxial growth, an etch step, and a second selective epitaxial growth, respectively, according to embodiments of the present disclosure. The first selective epitaxial growth is performed to deposit polysilicon on the exposed portions of the polysilicon channel layers 155 in the cavity 170, i.e., on the sidewalls of the cavity 170. As other areas are covered by silicon oxide, the process of selective epitaxial growth may only grow polysilicon layers 171 on the exposed portions of the polysilicon channel layers 155, as shown in FIG. 13. As a result, the polysilicon sidewalls of the cavity 170 become thicker. The polysilicon layer 171 may be doped with n-type or p-type dopants.

As described above and shown in FIG. 13, because the silicon substrate 110 is covered by the silicon oxide layer 121, polysilicon may be only deposited on the exposed to portions of the polysilicon channel layers 155, i.e., the polysilicon sidewalls of the cavity 170, but single crystalline silicon cannot be deposited over the substrate 110. On the other hand, if the silicon oxide 121 does not exist, i.e., both the polysilicon sidewalls of the cavity 170 and the single crystalline silicon substrate 110, which is the bottom of the cavity 170 in this scenario, are exposed, polysilicon may be deposited on the sidewalls and single crystalline silicon may be deposited on the substrate 110, respectively. However, in such a scenario, the growth rate of silicon (e.g., single crystalline silicon) on the substrate 110 can be larger than that of silicon (e.g., polysilicon) on the sidewalls. In particular, silicon layers may grow faster on portions of the substrate 110 that are opposite to openings 172 of the cavity 170 than on the sidewalls that are farther away from the openings 172. Consequently, the silicon deposited on the substrate 110 may approach and seal the openings 172 before the thickness of the polysilicon layers deposited on some of the sidewalls that are farther away from the openings 172 reaches a predetermined value. As a result, voids may form around some of the channel holes 150, especially those in the middle between the openings 172. As the polysilicon sidewall is connected to the channel layer 155 in the channel hole 150, if the polysilicon thickness of the sidewall is below the predetermined value, the channel layer 155 may have a poor electrical connection to the array common source (ACS) and may even cause failure of corresponding NAND memory cells that are connected to the channel layer.

Referring again to FIG. 13, the silicon oxide layer 121 may be removed by, e.g., a selective wet etch process, which exposes the top surface of the substrate 110 at the bottom of the cavity 170. During the selective wet etch process, the layer 162 may be partially etched. As described above, the layer 162 may be sufficiently thicker than the layer 121. As such, in some embodiments, only a part of the layer 162 may be removed after the selective wet etch. The remaining part of the layer 162 may form a layer 1621, as shown in FIG. 14. Subsequently, a second selective epitaxial growth is performed. Since both the polysilicon sidewalls and the single crystalline silicon substrate 110 are exposed, polysilicon silicon is grown on the sidewalls to make the polysilicon layers 171 thicker, and a single crystalline silicon layer 173 is grown on the substrate 110, as shown in FIG. 15. The polysilicon layer 171 includes two parts formed by the first and second selective epitaxial growth processes, respectively, which can be adjacent and parallel to each other. The single crystalline silicon layer 173 is adjacent and parallel to the top surface of the substrate 110. The polysilicon layer 171 and the single crystalline layer 173 may be doped with n-type or p-type dopants.

As described above, the layer 171 includes two parts that are grown in two selective epitaxial growth processes. In the first selective epitaxial growth, only the layer 171 is grown. In the second selective epitaxial growth, the layer 171 is thickened and the layer 173 is grown. Further, during the second selective epitaxial growth, the layers 171 and 173 adjoin each other in regions close to the channel layers 155 and become coupled electrically.

Figure 16:
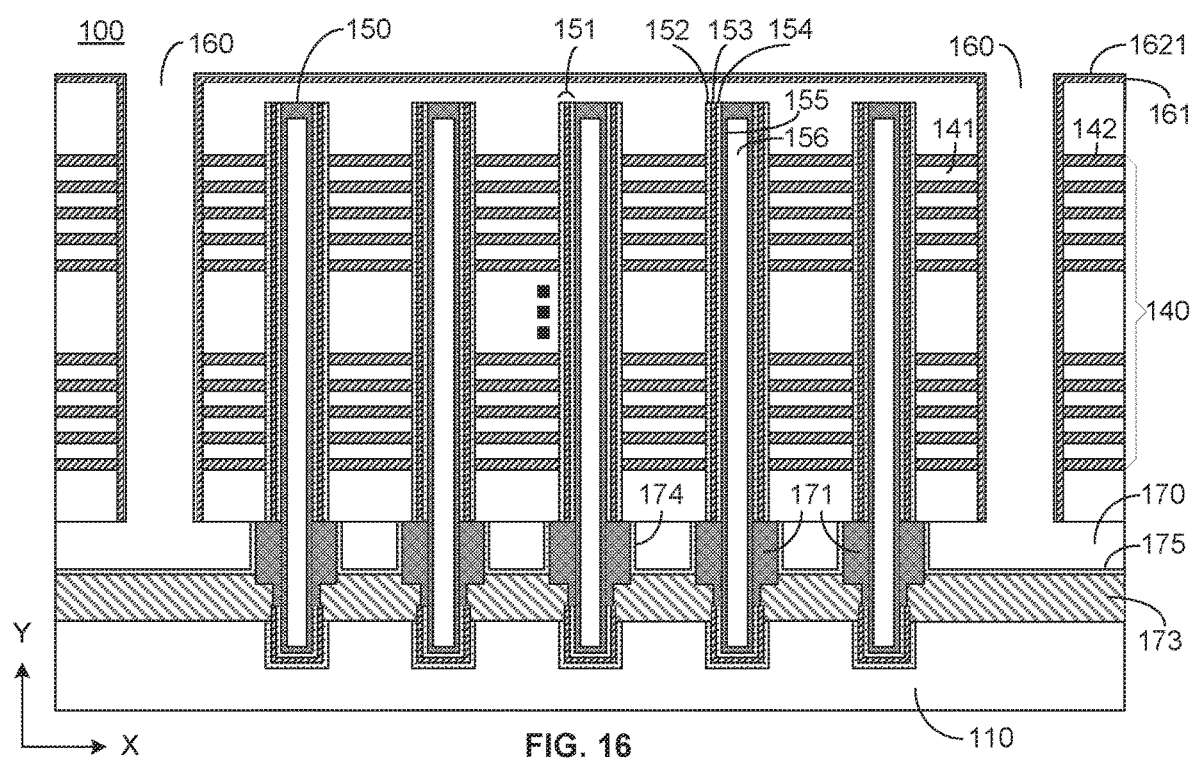
FIGS. 16-21 illustrate schematically cross-sectional views of the 3D memory device shown in FIG. 15 after additional fabrication steps are performed according to embodiments of the present disclosure.

FIGS. 16-21 each schematically show a cross-sectional view of the 3D memory device 100 after one or more additional fabrication steps are performed according to embodiments of the present disclosure. Following the second selective epitaxial growth, an oxidation process is performed. As such, silicon oxide layers 174 and 175 are formed on and to cover the layers 171 and 173, respectively, as shown in FIG. 16. In some embodiments, the layers 174 and 175 may be configured sufficiently thicker than the layer 1621.

Figure 17:
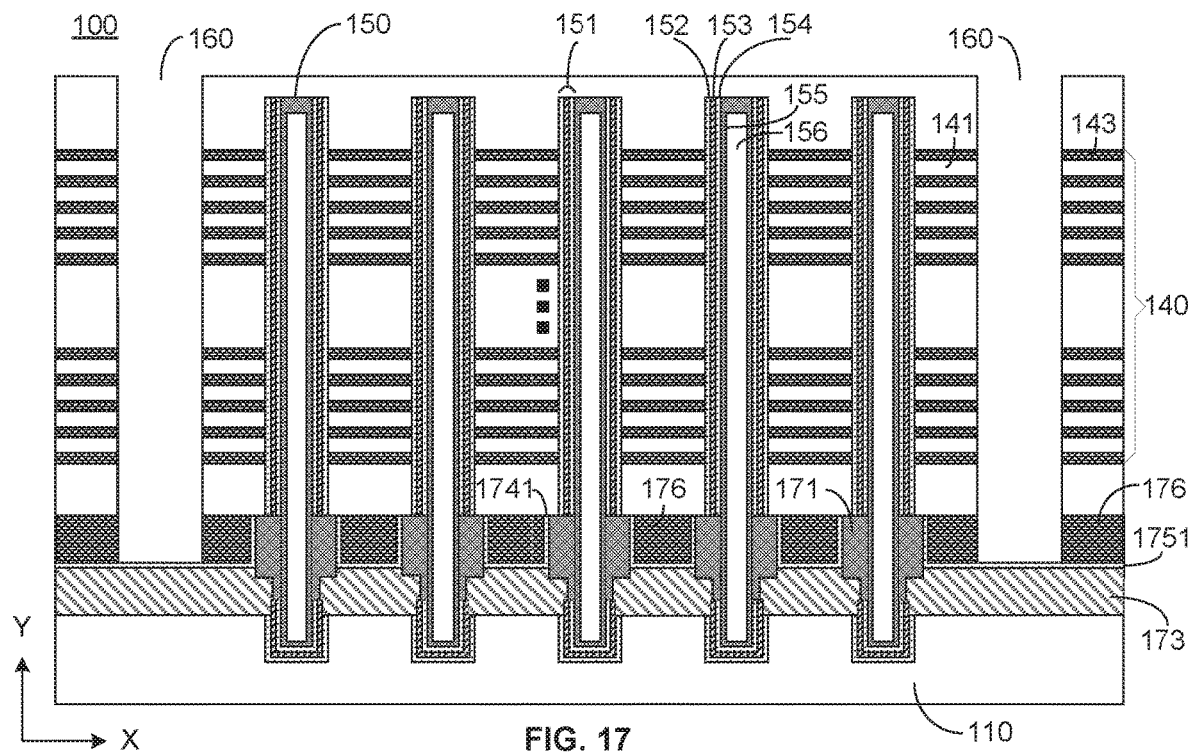

Thereafter, one or more etch processes, such as one or more selective wet etch processes, are performed to remove the silicon oxide layer 1621 and the silicon nitride layer 161. In some embodiments, when the layer 1621 is etched away, the layers 174 and 175 are etched partially. The remaining parts of the layer 174 and 175 form layers 1741 and 1751, respectively. Because the layers 142 of the layer stack 140 are also silicon nitride layers, the silicon nitride layers 142 are removed during the etch process for removing the silicon nitride layer 161, leaving cavities between the silicon oxide layers 141. Then, a conductive material such as W is grown to fill the cavities left by the removal of the layers 142, forming conductor layers 143 between the silicon oxide layers 141. That is, the conductor layers 143 replace the dielectric layers 142 and the layer stack 140 now includes alternating dielectric layers 141 and conductor layers 143, as shown in FIG. 17. The conductor layers 143 can be parallel to the substrate 110 and a portion of each functional layer 151 in a channel hole 150 is between a portion of one of the conductor layers 143 and a portion of the channel layer 155 in the channel hole 150. In addition to forming the conductor layers 143, because the openings 172 of the cavity 170 are still open, the deposition of W also at least partially fills the cavity 170 with the conductive material, such as W, to form a conductive layer 176 over the substrate 110. As shown in FIG. 17, the conductive layer 176 is isolated from the layers 171 by the silicon oxide layer 174 and surrounds the layers 171. The conductive material may be deposited by CVD, PVD, ALD, or a combination of two or more of these processes. In some embodiments, another metal, such as Co, Cu, or Al, may be used as the conductive material for forming the conductive layer 176 and the conductor layers 143.

Each conductor layer 143 is configured to electrically connect one or more rows of NAND memory cells along the X direction or in the X-Z plane and is configured as a word line for the 3D memory device 100. The channel layer 155 formed in the channel hole 150 is configured to electrically connect a column or a string of NAND memory cells along the Y direction and is configured as a bit line for the 3D memory device 100. As such, a portion of the functional layer 151 in the X-Z plane in the channel hole 150, as a part of a NAND memory cell, is arranged between a conductor layer 143 and a channel layer 155, i.e., between a word line and a bit line. A portion of the conductor layer 143 that is around a portion of the channel hole 150 functions as a control gate for a NAND memory cell. The 3D memory device 100 as depicted in FIG. 17 can be considered as including a 2D array of strings of NAND cells (such a string is also referred to as a "NAND string"). Each NAND string contains multiple NAND cells and extends vertically toward the substrate 110. The NAND strings form a 3D arrangement of the NAND memory cells.

Figure 18:
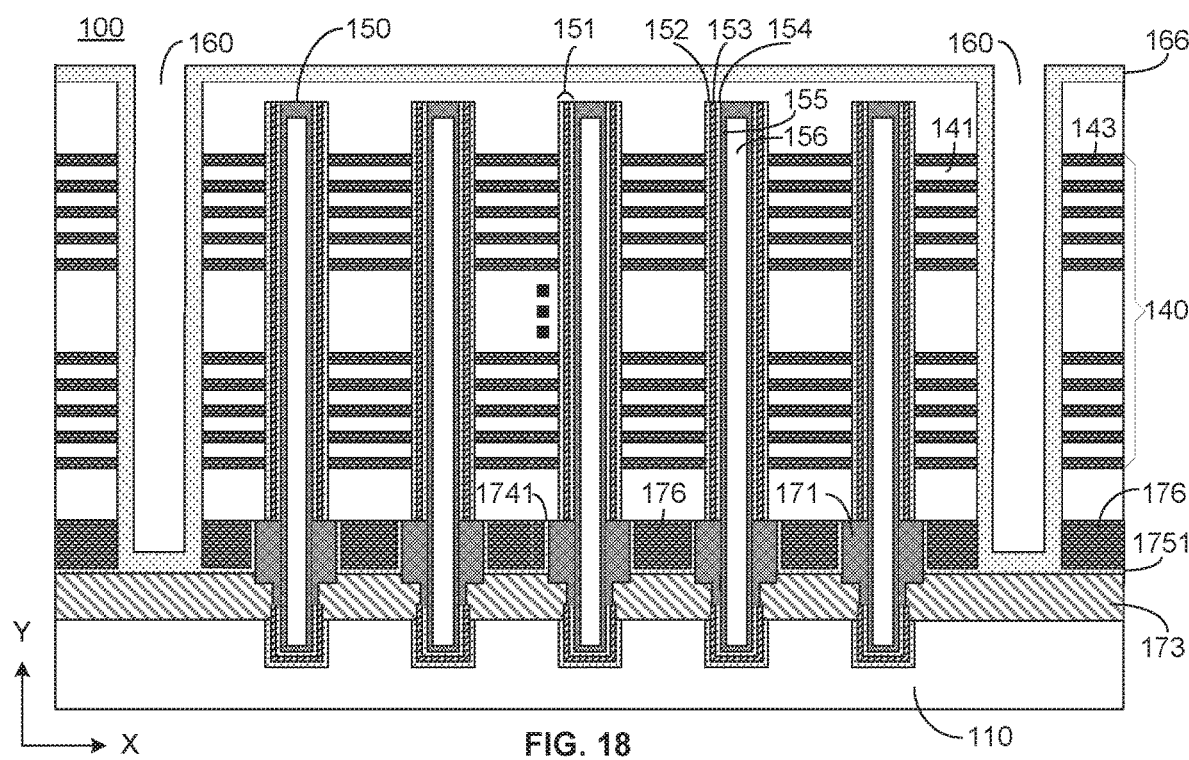
Figure 19:
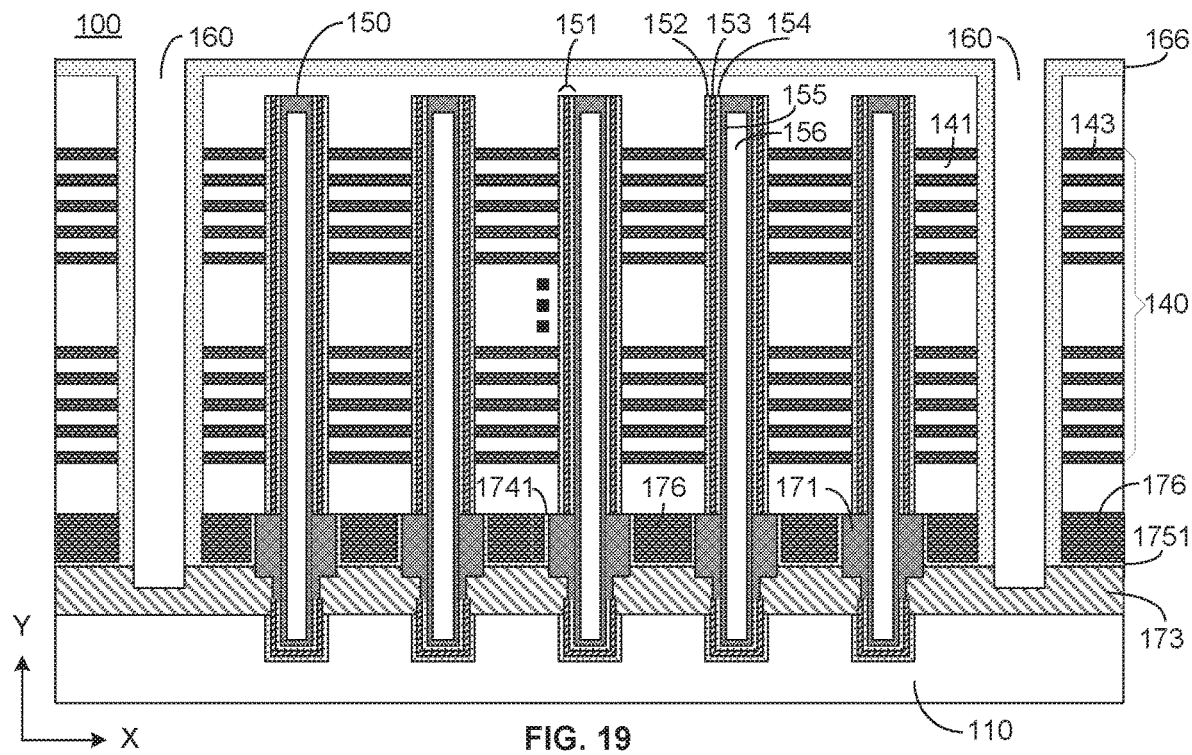

As shown in FIG. 18, a silicon oxide layer 166 is deposited on the 3D NAND memory device 100 after the layers 143 and 176 are formed. The layer 166 may be deposited by CVD, PVD, ALD, or a combination of two or more of these processes. Then, a dry etch process or a combination of dry etch and wet etch processes may be performed to create an opening at the bottom of each GLS 160. As a result, a portion of the layer 166, a portion of the layer 176, a portion of the layer 175, and a portion of the layer 173 are removed, as shown in FIG. 19.

Figure 20:
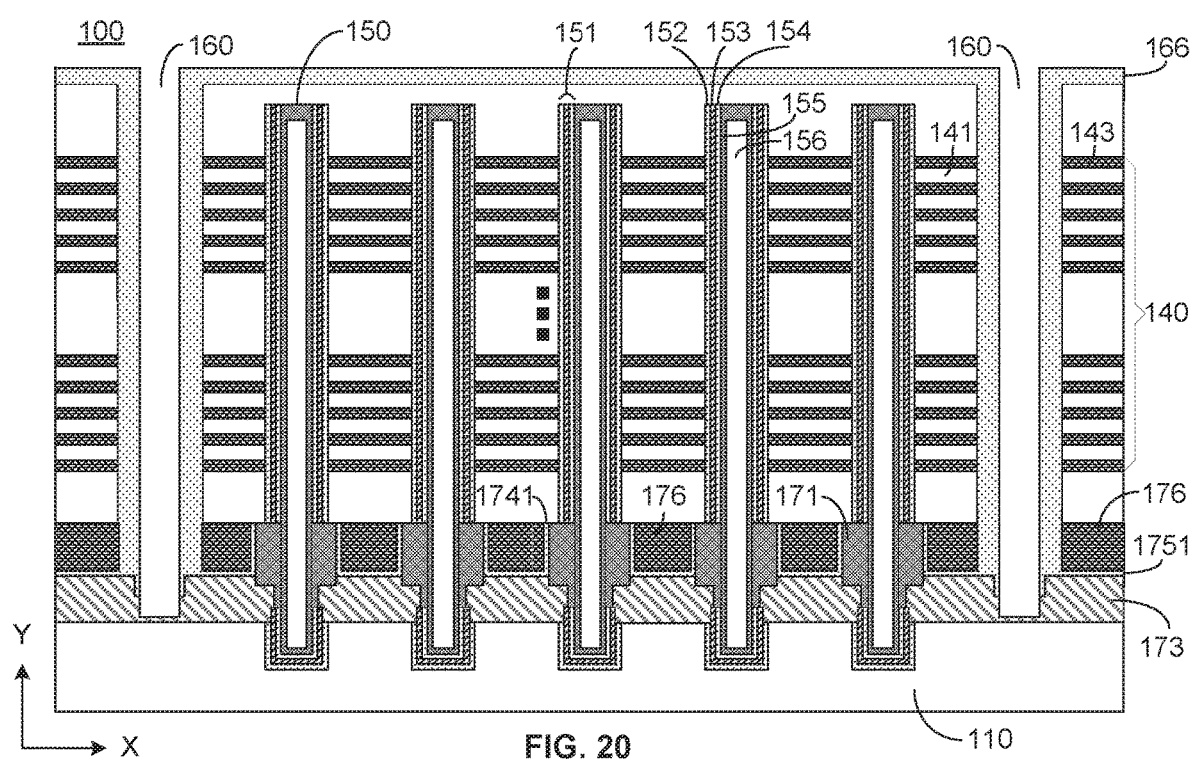
Figure 21:
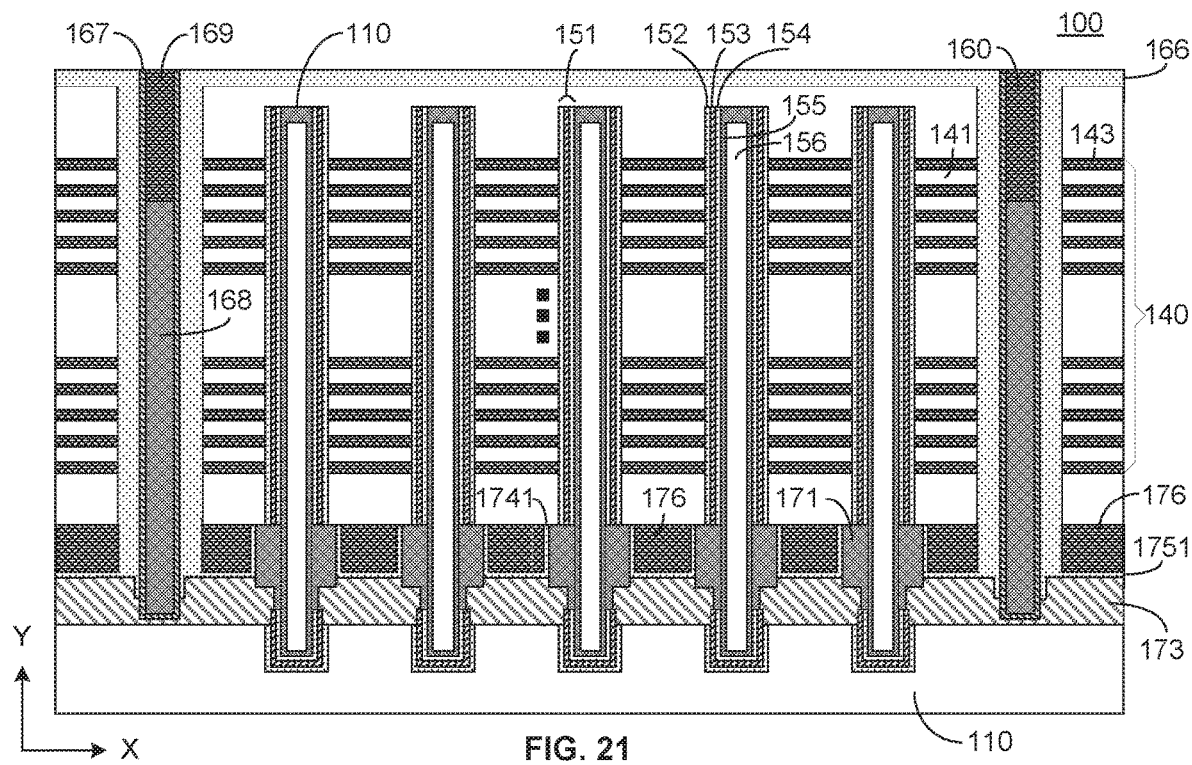

Next, in some embodiments, the processes of silicon oxide deposition and dry etch or dry/wet etch are performed again (In some other embodiments, the processes of silicon oxide deposition and dry etch or dry/wet etch are not performed again), the results of which are shown in FIG. 20. As shown in FIG. 20, the oxide layer 166 becomes thicker and part of the layer 166 covers the sides of the conductive layer 176 close to the bottoms of the GLS's 160. The etch process also exposes parts of the layer 173. Then, processes are performed to form the ACS's in the GLS's 160. The ACS's, as electrically conductive channels, extend through the layer stack 140 and connect with the layers 173 and 171 electrically. For example, as shown in FIG. 21, a conductive layer 167 including a conductive material such as titanium nitride, W, Co, Cu, Al, doped silicon, or silicide may be deposited to cover the silicon oxide sidewall and contact the layer 173 at the bottom of the GLS 160. The GLS 160 may then be filled with a conductive material 168 such as doped polysilicon and sealed by a conductive plug 169 that may be made of a metal such as W, Co, Cu, or Al. Then, other fabrication steps or processes are performed to complete fabrication of the device 100.

FIGS. 22-26 schematically show a fabrication process of another example 3D memory device 200 according to embodiments of the present disclosure. The structure of the 3D memory device 200 can be similar to that of the device 100, except that the 3D memory device 200 includes a single-layer cover layer 125 instead of the composite cover layer of the device 100 that includes the layers 121-124 of the device 100. In some embodiments, the layer 125 may include a material that cannot be etched by the etchants used to etch silicon oxide, silicon nitride, and polysilicon. In some embodiments, the etch rate of the material of the layer 125 in the etchants used during the fabrication for etching silicon oxide, silicon nitride, and polysilicon can be much slower, e.g., 10 times slower, than the etch rate for the etchants to etch silicon oxide, silicon nitride, and polysilicon. For example, the layer 125 may include aluminum oxide.

Figure 22:
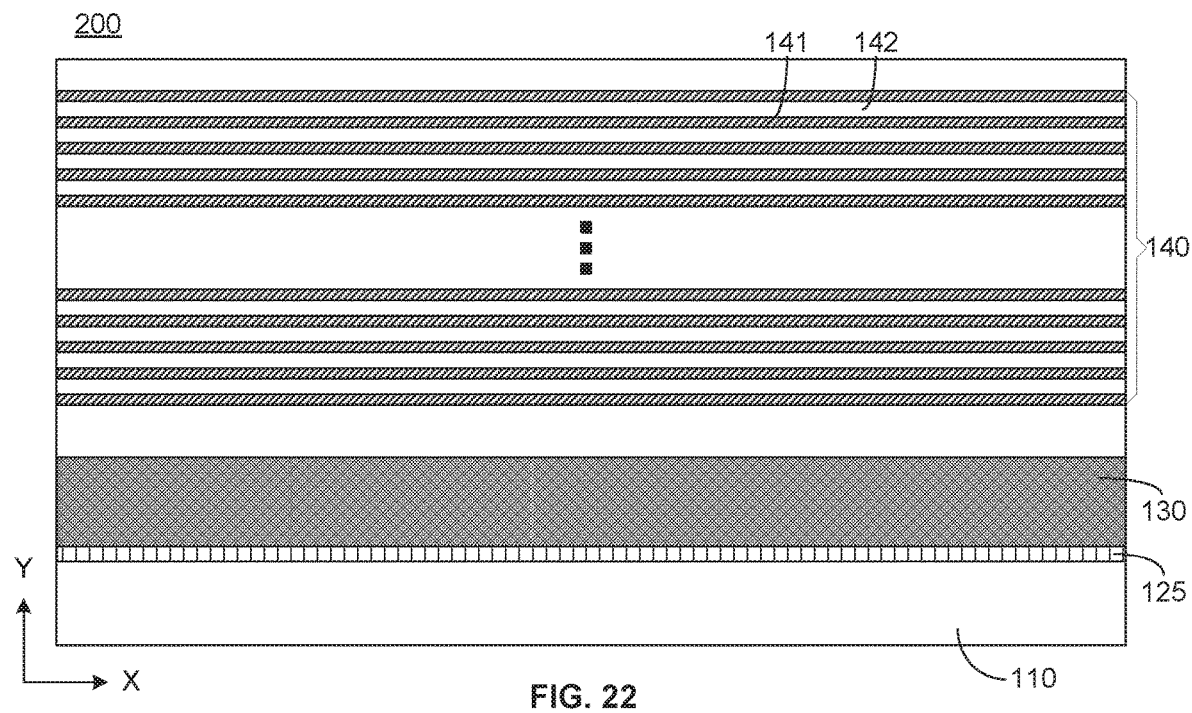
FIG. 22 illustrates schematically a cross-sectional view of another 3D memory device in an exemplary fabrication process according to embodiments of the present disclosure.
Figure 23:
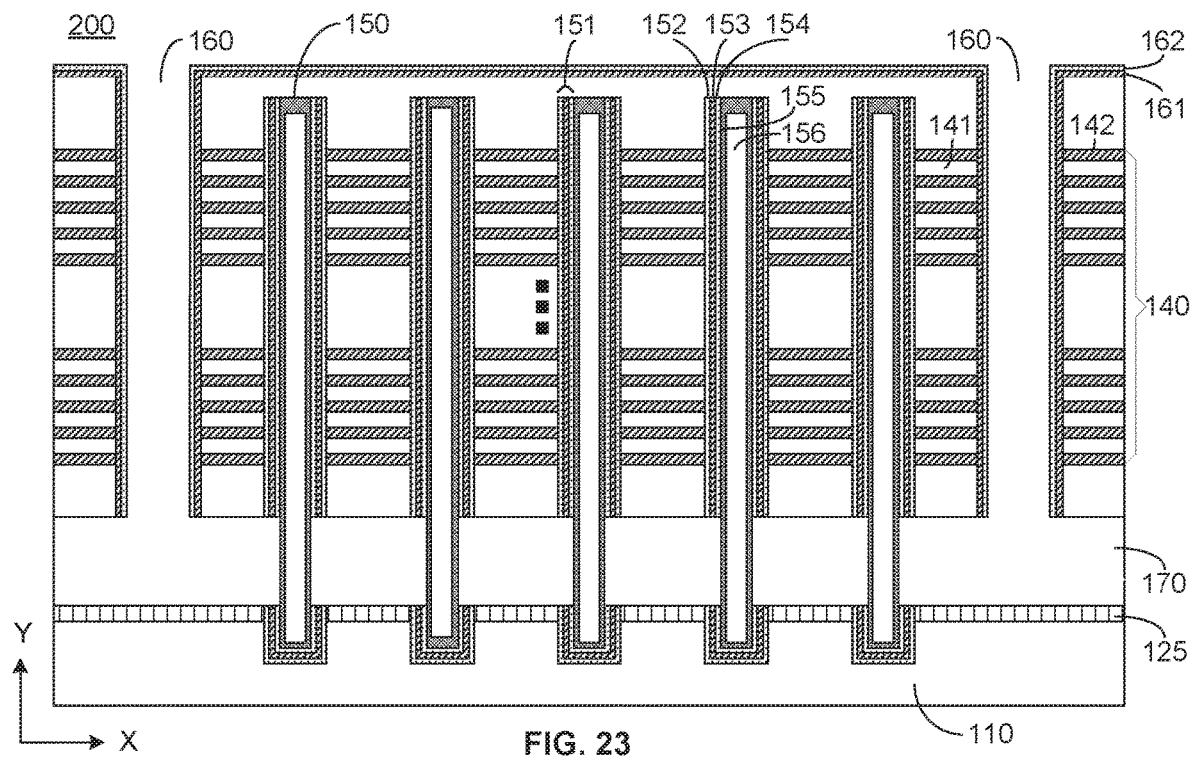
FIGS. 23-26 illustrate schematically cross-sectional views of the 3D memory device shown in FIG. 22 after several fabrication steps are performed according to embodiments of the present disclosure.

As shown in FIG. 22, when the 3D memory device 200 is fabricated, the cover layer 125 is deposited over a top surface of the substrate 110 by CVD, PVD, ALD, or a combination of two or more of these processes. Next, like in the device 100, a sacrificial layer, such as the polysilicon layer 130, and the layer stack 140 including alternating stack layers 141 and 142 are deposited sequentially over the cover layer 125. Like in the device 100, the stack layers 141 and 142 of the device 200 also may exemplarily include silicon oxide and silicon nitride, respectively. As shown in FIG. 23, like in the device 100, the device 200 also includes to the channel holes 150, the functional layers 151, and the polysilicon channel layers 155 (semiconductor channels). The functional layers 151 are formed on the sidewalls of the channel holes 150 in the same way as that for the device 100. The functional layer 151 may exemplarily include a silicon oxide layer as the blocking layer 152 deposited on the sidewall of the channel hole 150, a silicon nitride layer as the storage layer 153 deposited on a surface of the blocking layer 152, and a silicon oxide layer as the tunnel insulation layer 154 deposited on a surface of the storage layer 153. The polysilicon channel layer 155 is deposited on a surface of the tunnel insulation layer 154. The channel holes 150 may be filled with the dielectric material 156.

Next, the GLS 160 is formed and GLS spacers are deposited. The GLS spacers of the device 200 may, for example, include the same layers 161-165 as that of the device 100. Like for the device 100, multiple etch processes, e.g., multiple selective wet etch processes, are performed to remove the polysilicon layer 130, the layers 165, 164, and 163 of the GLS spacers, and exposed bottom portions of the blocking layers 152, the storage layers 153, and the tunnel insulation layers 154 in the cavity 170, respectively. Then, the portions of the polysilicon channel layers 155 or the polysilicon sidewalls in the cavity 170 are exposed, while the substrate 110 is still covered by the layer 125 at the bottom of the cavity 170, as shown in FIG. 23.

Figure 24:
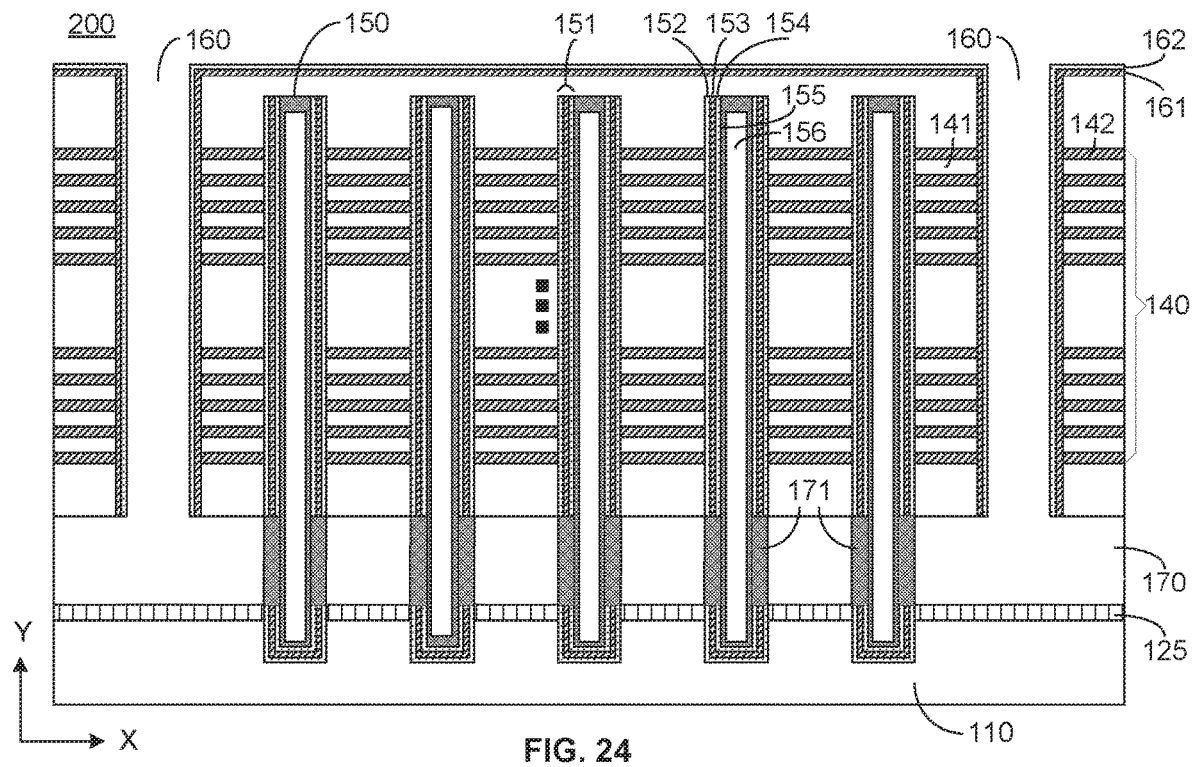
Figure 25:
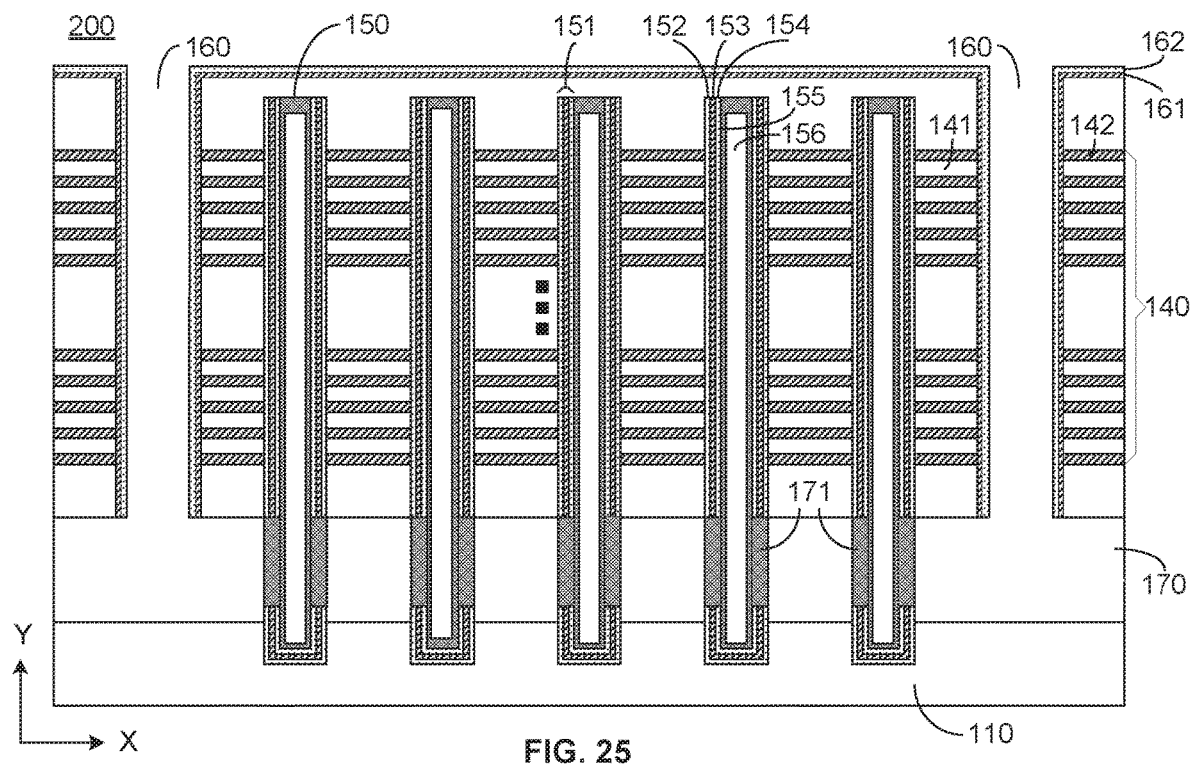

Like the fabrication processes for the device 100, a first selective epitaxial growth may be performed to only grow a polysilicon layer 171 on the polysilicon sidewalls in the cavity 170, as shown in FIG. 24. Then, the cover layer 125 is etched out in an etch process, e.g., a selective wet etch process. As shown in FIG. 25, the top surface of the substrate 110 is exposed after the etch process.

Figure 26:
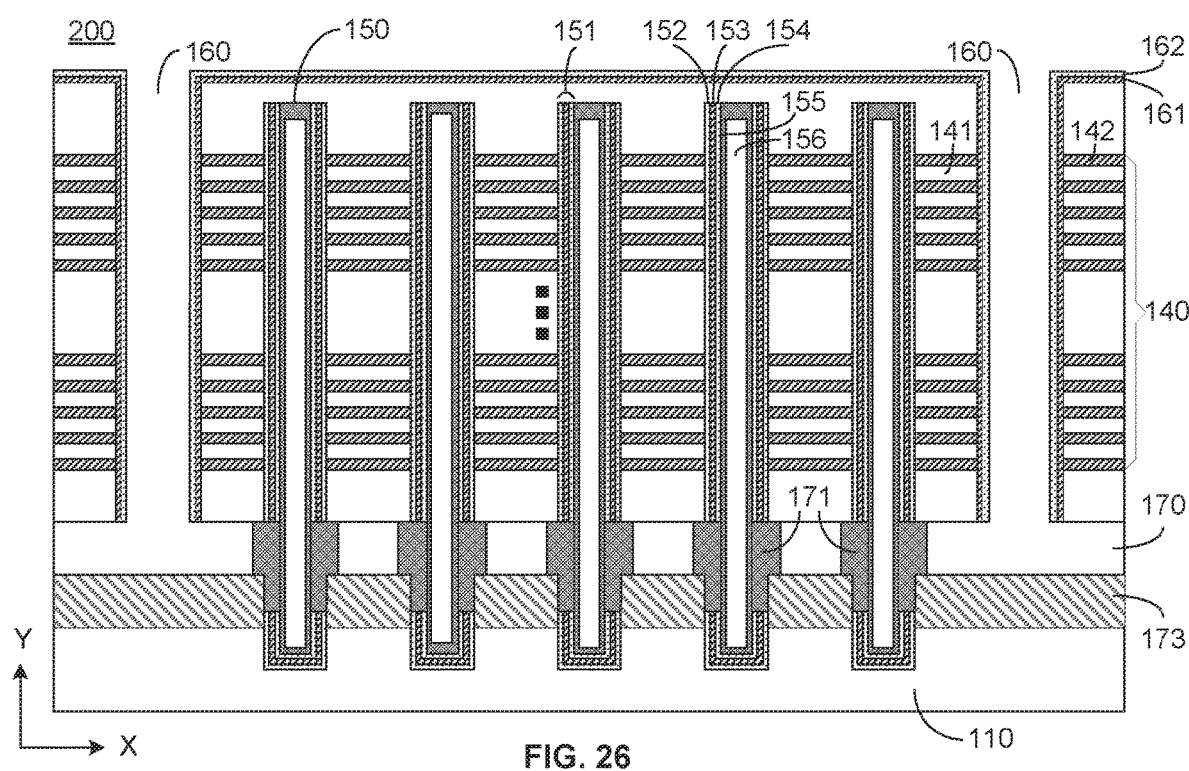

Thereafter, a second selective epitaxial growth is performed to thicken the polysilicon layer 171 on the polysilicon sidewalls of the cavity 170 and grow a single crystalline silicon layer 173 on the substrate 110 simultaneously, as shown in FIG. 26. Like in the device 100, the layers 171 and 173 of the device 200 may be doped with p-type or n-type dopants. The layers 171 and 173 adjoin each other in regions close to the channel layers 155 and become electrically coupled.

As such, the layer 171 is grown by two subsequent processes of selective epitaxial growth and includes two parts corresponding to the two processes. In comparison, the layer 173 is formed in only one selective epitaxial growth. During the first selective epitaxial growth, only the growth of the layer 171 takes place, as the substrate 110 is shielded by the cover layer 125. During the second selective epitaxial growth, both the growth of the layer 171 and the growth of the layer 173 take place.

After the second selective epitaxial growth, like for the device 100, an oxidation process is performed to form oxide layers on the exposed surfaces of the layers 171 and 173. In some embodiments, the oxide layers on the exposed surfaces of the layers 171 and 173 are configured sufficiently thicker than the layer 162. Then etch processes, e.g., selective wet etch processes, are performed to remove the silicon oxide layer 162 and the silicon nitride layers 161 and 142. Next, cavities left by the layers 142 are filled by metal such as W to form conductor layers. The conductor layers are configured as the word lines of the 3D memory device 200 and the channel layers 155 (the semiconductor channels) are configured as the bit lines. Like the device 100, deposition of oxide layers and etch processes are used to expose the layer 173 at the bottom of the GLS 160 and electrically conductive materials are deposited to form the ACS. After that, other fabrication steps or processes are performed to complete fabrication of the device 200.

Figure 27:
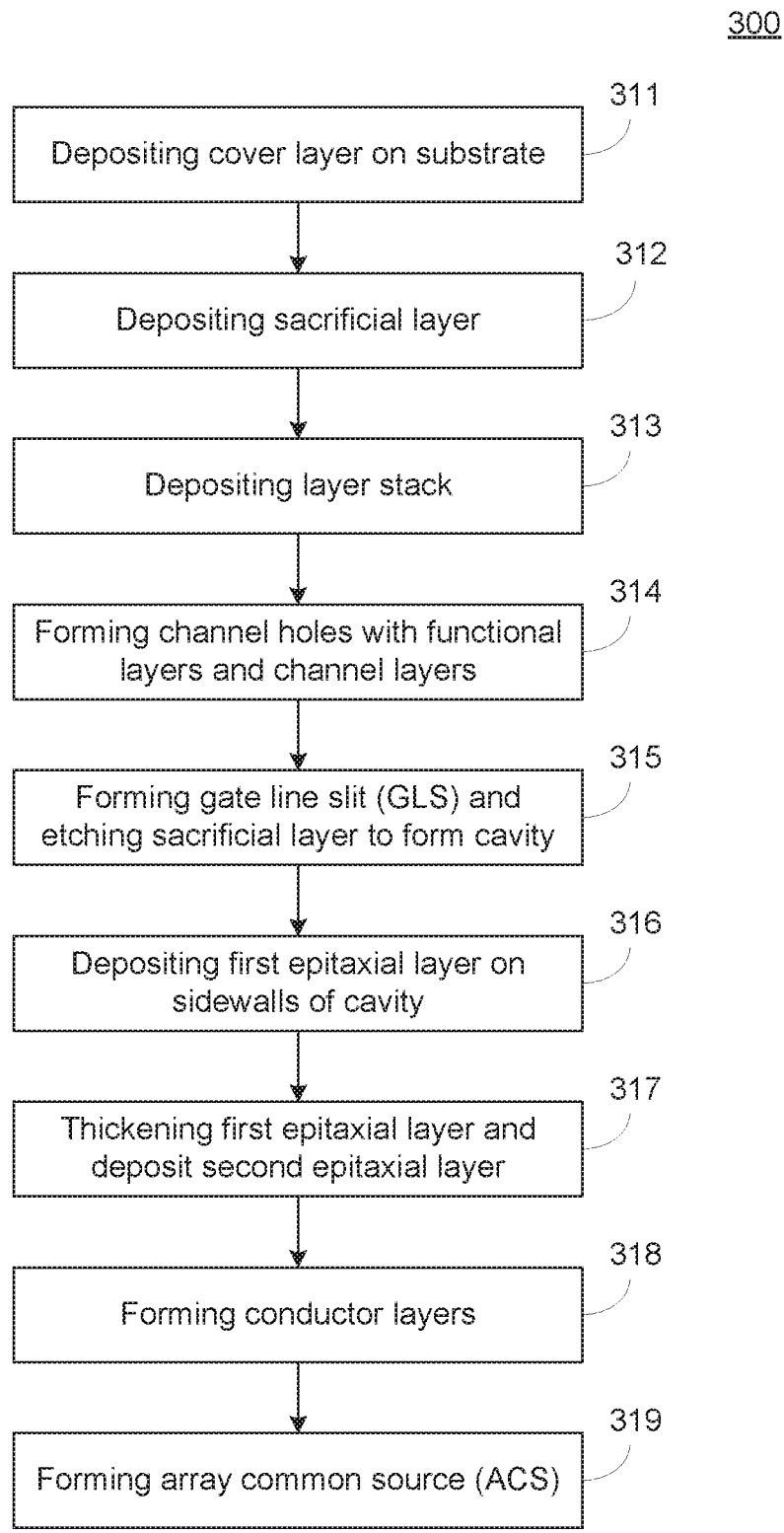
FIG. 27 illustrates a schematic flow chart of fabrication of a 3D memory device according to embodiments of the present disclosure.

FIG. 27 shows a schematic flow chart 300 for fabricating a 3D memory device according to embodiments of the present disclosure. At 311, a cover layer is deposited over a top surface of a substrate. The substrate can include a semiconductor substrate, such as a single crystalline silicon substrate. In some embodiments, the cover layer can include a single aluminum oxide layer. In some other embodiments, the cover layer can include a composite layer including four layers deposited sequentially over the substrate. Among the four layers, the first and third layers may include silicon oxide and the second and fourth layers may include silicon nitride. In some other embodiments, the cover layer can have another configuration, depending on designs of the functional layer and the GLS spacers of the 3D memory device. At 312, a sacrificial layer such as a polysilicon layer is deposited on the cover layer. At 313, a layer stack is deposited above the sacrificial layer. The layer stack includes a first stack layer and a second stack layer that are alternately stacked. In some embodiments, the first stack layer may include a first dielectric layer and the second stack layer may include a second dielectric layer that is different than the first dielectric layer. In some other embodiments, the first and second stack layers may include a dielectric layer and an electrically conductive layer, respectively.

At 314, channel holes are formed through the layer stack, the sacrificial layer, and the cover layer to expose portions of the substrate. A functional layer and a channel layer are deposited on the sidewall of each channel hole. Forming the functional layer can include depositing a blocking layer on the sidewall of the channel hole, depositing a storage layer on the blocking layer, and depositing a tunnel insulation layer on the storage layer. The channel layer, deposited on the tunnel insulation layer, functions as a semiconductor channel and can include a polysilicon layer.

At 315, a GLS is formed that extends vertically through the layer stack and into the sacrificial layer, and exposes a portion of the sacrificial layer. Next, the sacrificial layer is etched away and a cavity is created above the cover layer. The cavity exposes a portion of the blocking layer of the functional layer and a portion of the cover layer. Then, the layers of the functional layer exposed sequentially in the cavity, including the blocking layer, the storage layer, and the tunnel insulation layer, are etched away by, e.g., one or more etch processes, respectively. As a result, a portion of the functional layer that is close to the substrate is removed to expose a side portion of the channel layer in the cavity. At least a portion of the cover layer is left and still covers the substrate.

At 316, a first selective epitaxial growth is performed to grow a first epitaxial layer on the exposed portion of the channel layer (i.e., the sidewall) in the cavity. Next, the cover layer on the substrate is removed by etching, e.g., a selective wet etch. A portion of the top surface of the substrate is exposed.

At 317, a second selective epitaxial growth is performed to simultaneously thicken the first epitaxial layer and deposit a second epitaxial layer on the substrate. The first epitaxial layer can be a polysilicon layer and the second epitaxial layer can be a single crystalline silicon layer. Oxide layers can be then formed on the first and second epitaxial layers.

In some embodiments that the layer stack includes two dielectric stack layers, one of the first and second stack layers is etched away at 318 to leave cavities, which are then filled with an electrically conductive material to form conductor layers. The electrically conductive material may include a metal such as W, Co, Cu, or Al.

At 319, oxide layers are deposited and etched selectively at the GLS. Electrically conductive materials, such as titanium nitride, W, Cu, Al, and/or doped polysilicon are deposited in the GLS to form an ACS.

FIGS. 28-33 schematically show a fabrication process of another example 3D memory device 400 according to embodiments of the present disclosure. The structure of the 3D memory device 400 can be similar to those of the device 100 and the device 200. One difference between the device 400 and the devices 100, 200 is that the channel holes and channel layers (semiconductor channels) of the device 400 have a protruding portion for enhancing electrical connection with the ACS. When a channel hole is formed by an etch process, e.g., a dry etch process, the shape of the channel hole may not be an ideal cylindrical shape, but can be tapered to a certain degree. That is, the hole diameter at the top of the channel hole is larger than that at the bottom of the channel hole. When a channel hole is made deeper to accommodate more stack layers, the diameter difference becomes larger. A smaller channel hole diameter may cause electrical connection issues with the ACS, as the contact area is diminished when the hole diameter is reduced. Embodiments of the 3D memory device 400 are configured to improve the electrical connection between the channel layers and the ACS.

In the embodiments below, examples with the single-layer cover layer 125 (like in the device 200) are described. In some other embodiments, the device 400 can alternatively include a composite cover layer, like the cover layer 120 of the device 100.

Figure 28:
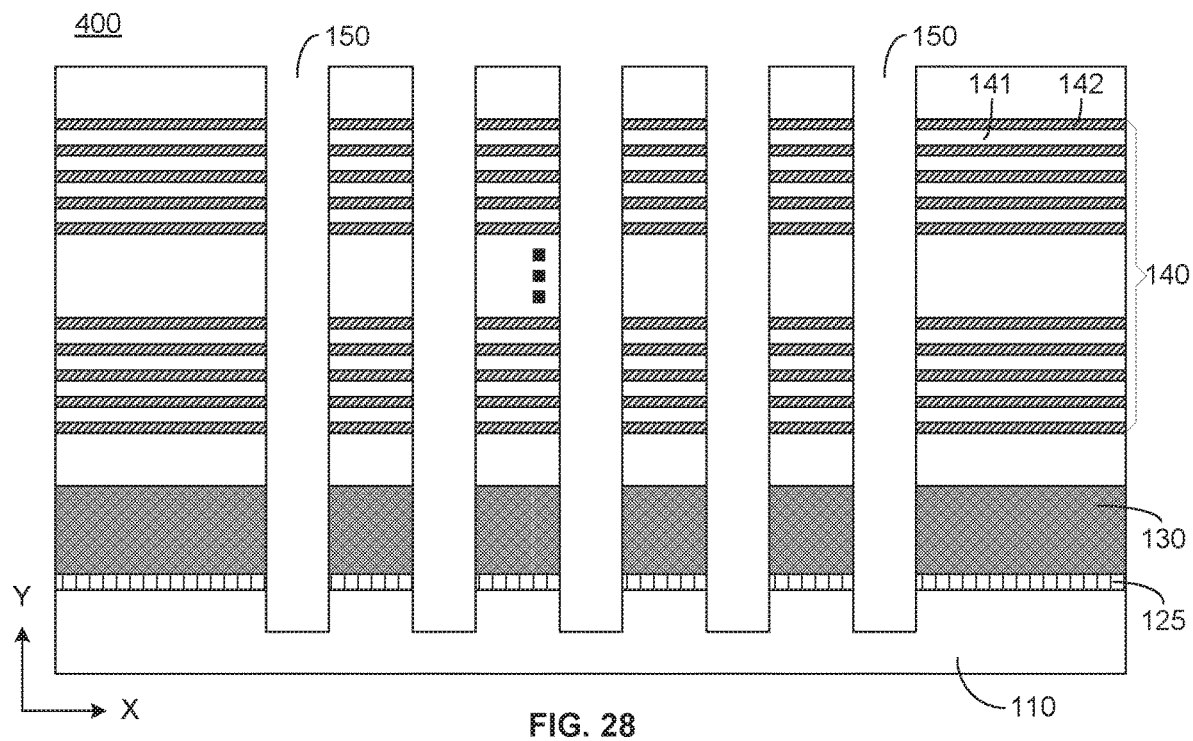
FIGS. 28-33 illustrate schematically cross-sectional views of another 3D memory device after several fabrication steps according to embodiments of the present disclosure.
Figure 29:
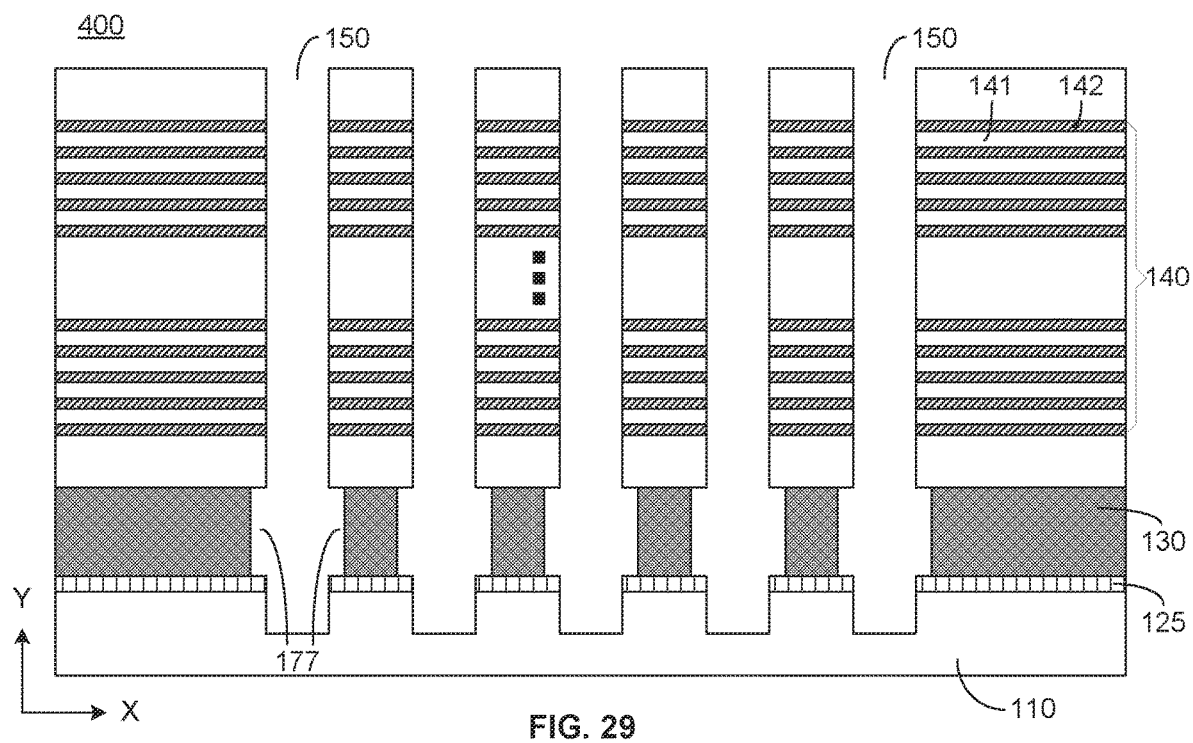

Referring to FIG. 28, in some embodiments, the cover layer 125 may include a material that cannot be etched by the etchants used to etch silicon oxide, silicon nitride, and polysilicon. In some embodiments, the etch rate of the material of the layer 125 in the etchants used during the fabrication for etching silicon oxide, silicon nitride, and polysilicon can be much slower, e.g., 10 times slower, than the etch rate for the etchants to etch silicon oxide, silicon nitride, and polysilicon. For example, the layer 125 may include aluminum oxide.

When the 3D memory device 400 is fabricated, the cover layer 125 is deposited over a top surface of the substrate 110 by CVD, PVD, ALD, or a combination of two or more of these processes. Next, like in the device 100, a sacrificial layer such as the polysilicon layer 130 and the layer stack 140 including the alternating stack layers 141 and 142 are deposited sequentially. Like in the device 100, the stack layers 141 and 142 exemplarily include silicon oxide and silicon nitride in the device 400. Next, the channel holes 150 are formed by dry etch or a combination of dry etch and wet etch.

The channel holes 150 extend through the layer stack 140, the polysilicon layer 130, and the cover layer 125, and partially penetrate into the substrate 110. The channel holes 150 expose the sides of the polysilicon layer 130. Then, an etch process, e.g., a selective wet etch is performed to selectively etch the polysilicon material, i.e., the polysilicon layer 130. The selective etch is performed to etch away a portion of the polysilicon layer 130, which creates a ring-shaped cavity 177 close to the bottom of the channel hole 150, as shown schematically in FIG. 29. The ring-shaped cavities 177 are configured between the layer stack 140 and the substrate 110. The cavity 177 makes the channel hole 150 have a protruding portion at the lower part or close to the bottom of the channel hole 150.

Figure 30:
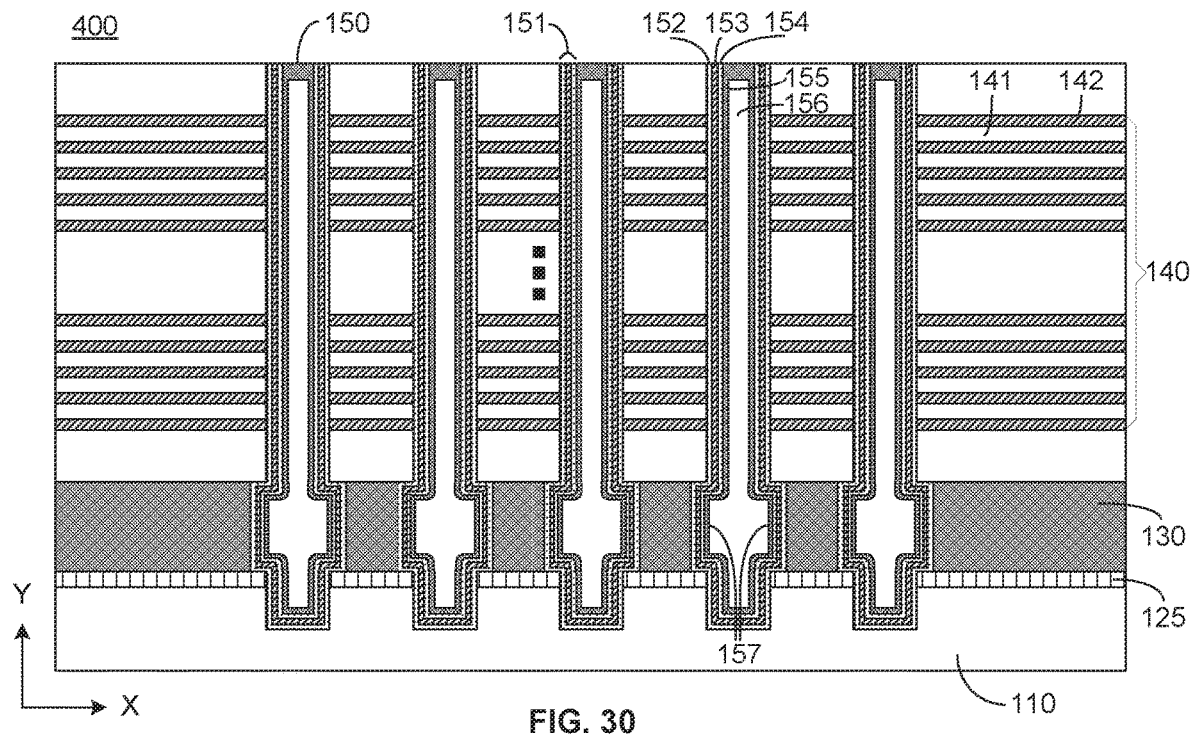

Referring to FIG. 30, like in the device 100, the functional layers 151 and the polysilicon channel layers 155 (semiconductor channels) are formed in the channel holes 150. The functional layer 151 is formed on the sidewall of the channel hole 150 in the same way as that in the device 100. The functional layer 151 exemplarily includes a silicon oxide layer as the blocking layer 152 deposited on the sidewall of the channel hole 150, a silicon nitride layer as the storage layer 153 deposited on a surface of the blocking layer 152, and a silicon oxide layer as the tunnel insulation layer 154 deposited on a surface of the storage layer 153. The polysilicon channel layer 155 is deposited on a surface of the tunnel insulation layer 154. The channel holes 150 may be filled with the dielectric material 156.

As the channel hole 150 has a protruding portion, i.e., the ring-shaped cavity 177, the functional layer 151 and the channel layer 155, which are deposited on the sidewall of the channel hole 150, have a protruding portion as well. For example, the channel layer 155 has a protruding portion 157 that protrudes outward. The protruding portion 157 is arranged between the layer stack 140 and the substrate 110, i.e., close to the bottom of the channel hole 150, as shown in FIG. 30. As the diameter of the channel hole 150 is enlarged at the portion 157 compared to other portions of the channel hole, the area of the sidewall at the portion 157 is enlarged. The enlarged sidewall area is configured to enhance the electrical connection with the ACS.

Figure 31:
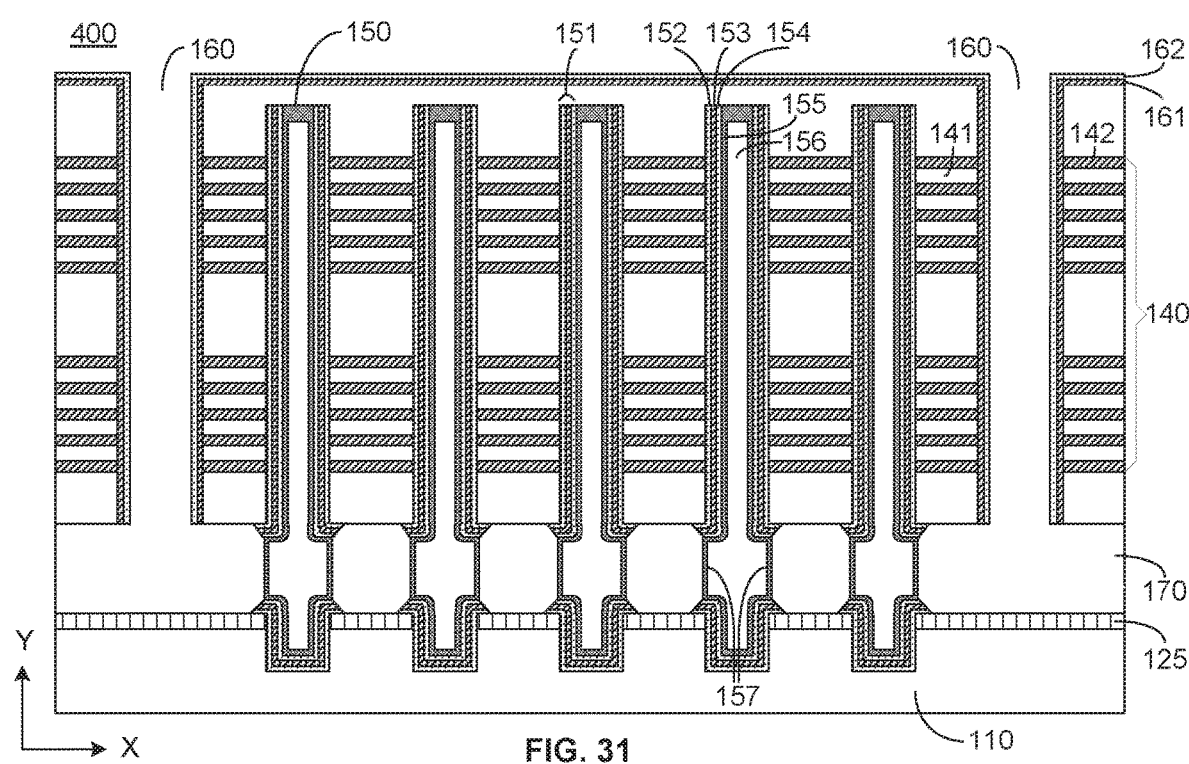
Figure 32:
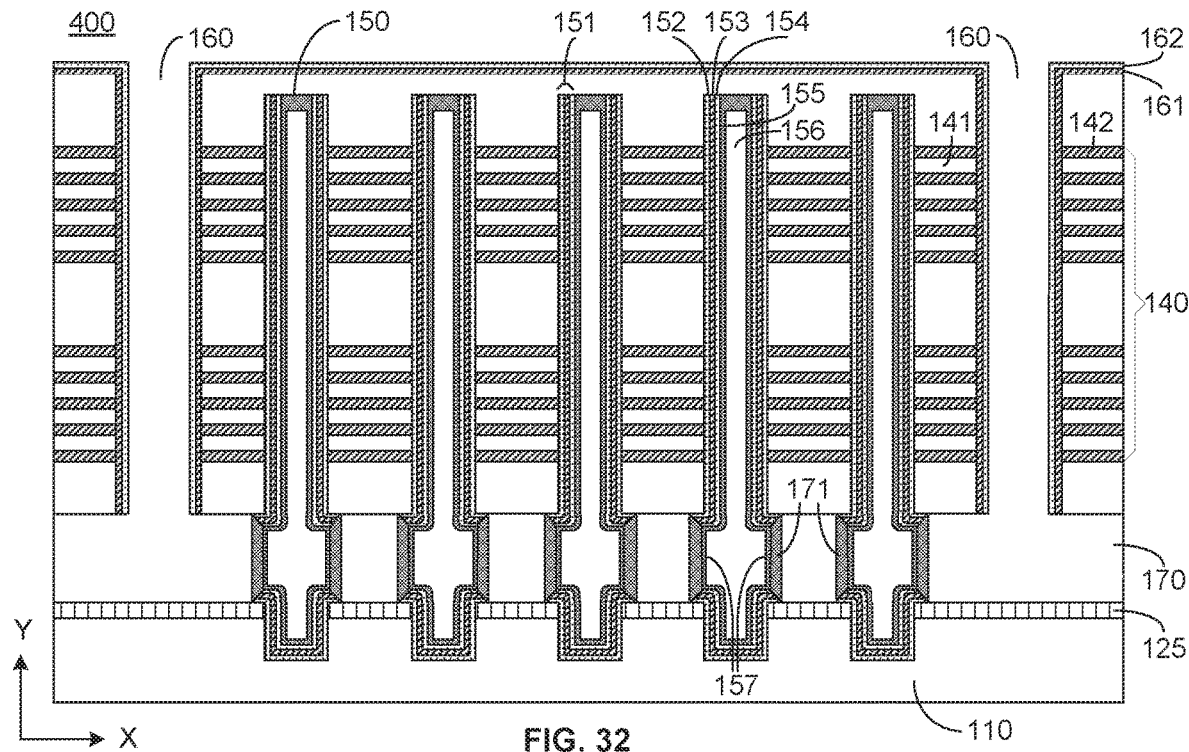

Thereafter, as shown in FIG. 31, the GLS 160 is formed and the GLS spacers are deposited. The GLS spacers of the device 400 may include, for example, the same layers 161-165 as that of the device 100. Like the device 100, multiple etch processes, e.g., multiple selective wet etch processes, are performed to remove the polysilicon layer 130, the layers 165, 164, and 163 of the GLS spacers, and exposed portions of the blocking layers 152, the storage layers 153, and the tunnel insulation layers 154 in the cavity 170, respectively. As a result, the portions 157 of the polysilicon channel layers 155 or polysilicon sidewalls in the cavity 170 are exposed, while the substrate 110 is still covered by the layer 125 at the bottom of the cavity 170, as shown in FIG. 31.

Like the fabrication processes for the device 100, a first selective epitaxial growth may be performed to only grow the polysilicon layer 171 on the polysilicon sidewall (the protruding portion 157) in the cavity 170, as shown in FIG.

32. Then the cover layer 125 is etched away in an etch process, e.g., a selective wet etch process.

Figure 33:
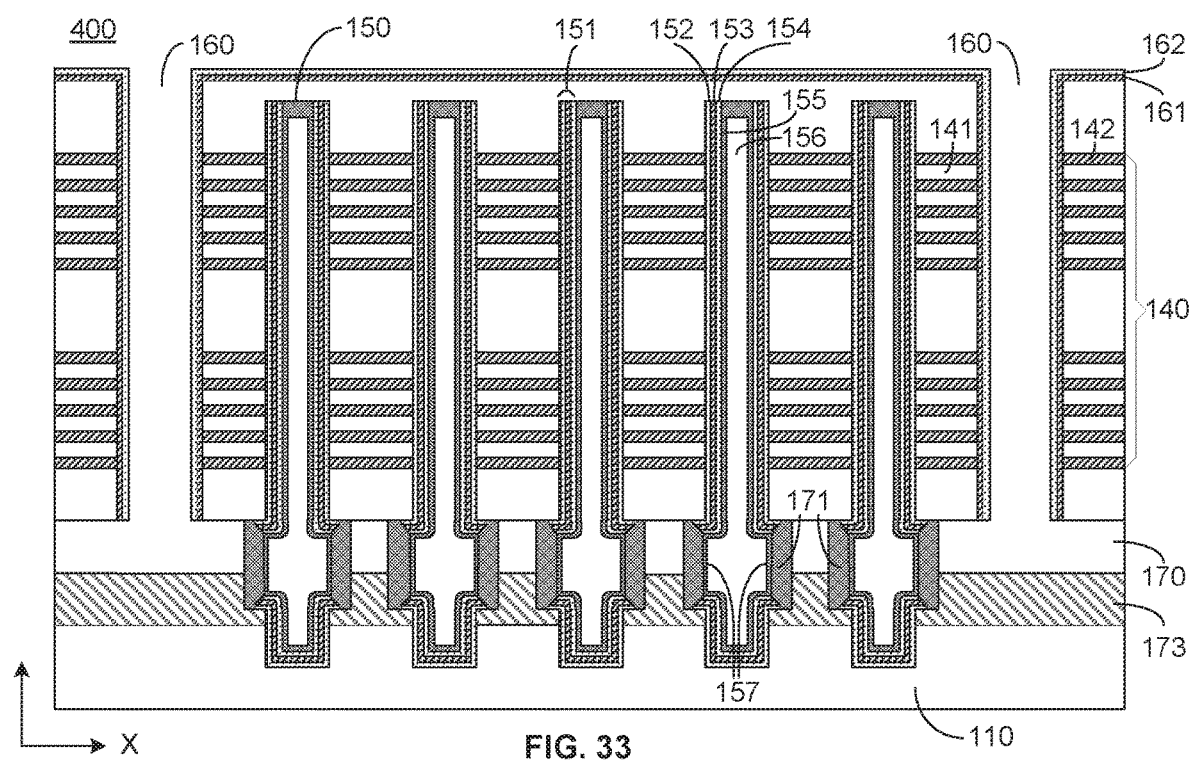

Next, a second selective epitaxial growth may be performed to grow the polysilicon layer 171 on the polysilicon sidewall and the single crystalline silicon layer 173 on the substrate 110 simultaneously, as shown in FIG. 33. Like in the device 100, the layers 171 and 173 in the device 400 may be doped with p-type or n-type dopants. The layers 171 and 173 adjoin each other in regions close to the protruding portion 157 and become coupled electrically.

After the second selective epitaxial growth, like in the device 100, an oxidation process may be performed to form oxide layers on the exposed surfaces of the layers 171 and 173. In some embodiments, the oxide layers on the layers 171 and 173 are configured sufficiently thicker than the layer 162. Then etch processes, e.g., selective wet etch processes, are performed to remove the silicon oxide layer 162 and the silicon nitride layers 161 and 142. Cavities left by the layers 142 are filled by metal such as W to form conductor layers. The conductor layers are configured as the word lines of the 3D memory device 400 and the channel layers 155 (the semiconductor channels) are configured as the bit lines. Like in the device 100, deposition of the oxide layers and etch processes are used to expose the layer 173 at the bottom of the GLS 160 and electrically conductive materials are deposited to form the ACS. Because of the protruding portion 157, the channel layer 155 has an enlarged contact area with the polysilicon layer 171. Hence, the electrical connection between the channel layer 155 and the ACS may be improved. Next, other fabrication steps or processes are performed to complete fabrication of the device 400.

Because the contact area between the channel layer 155 and the polysilicon layer 171 is enlarged by the protruding portion 157, in some embodiments, the 3D memory device 400 may still function properly when some parts of the polysilicon layers 171 is too thin, i.e., the layer thickness of some parts of the layer 171 is below the predetermined value. Hence, in some embodiments, the 3D memory device 400 may be fabricated without specifically depositing a cover layer to shield the substrate 110 during a selective epitaxial growth. Instead, no selective epitaxial growth is arranged to grow the polysilicon layer 171 exclusively. In such a scenario, the selective epitaxial growth is arranged to grow the polysilicon layer 171 and the single crystalline layer 173 at the same time.

FIGS. 34-41 schematically show a fabrication process of another example 3D memory device 500 according to embodiments of the present disclosure. The structure of the 3D memory device 500 can be similar to that of the devices 100 and 200, except that the tunnel insulation layer in the device 500 is not silicon oxide.

As described in more detail below, in the exemplary fabrication process shown in FIGS. 34-41 for the device 500, the cover layer for shielding the substrate is grown after the cavity 170 is formed. For example, in the example shown in FIGS. 34-41, the tunnel insulation layer 154 is not a silicon oxide layer, but a layer with a high-k dielectric material. The high-k dielectric material used for depositing the tunnel insulation layer may include a material that cannot be etched by the etchants used to etch silicon oxide and silicon nitride. In some embodiments, the etch rate of the high-k dielectric material in the etchants used during the fabrication for etching silicon oxide and silicon nitride can be much slower, e.g., 10 times slower, than the etch rate for the etchants to etch silicon oxide and silicon nitride. For example, the high-k dielectric material may include aluminum oxide, which is exemplarily used in the following descriptions.

The fabrication method for the 3D NAND memory device 500 may use one or more processes that are the same as or similar to those used for the devices 100, 200, and/or 400. For example, one or more deposition processes, one or more etch processes, and/or one or more filling processes used for the devices 100, 200, and 400 may be used in the fabrication of the device 500. Description of such processes is omitted or not repeated in detail.

Figure 34:
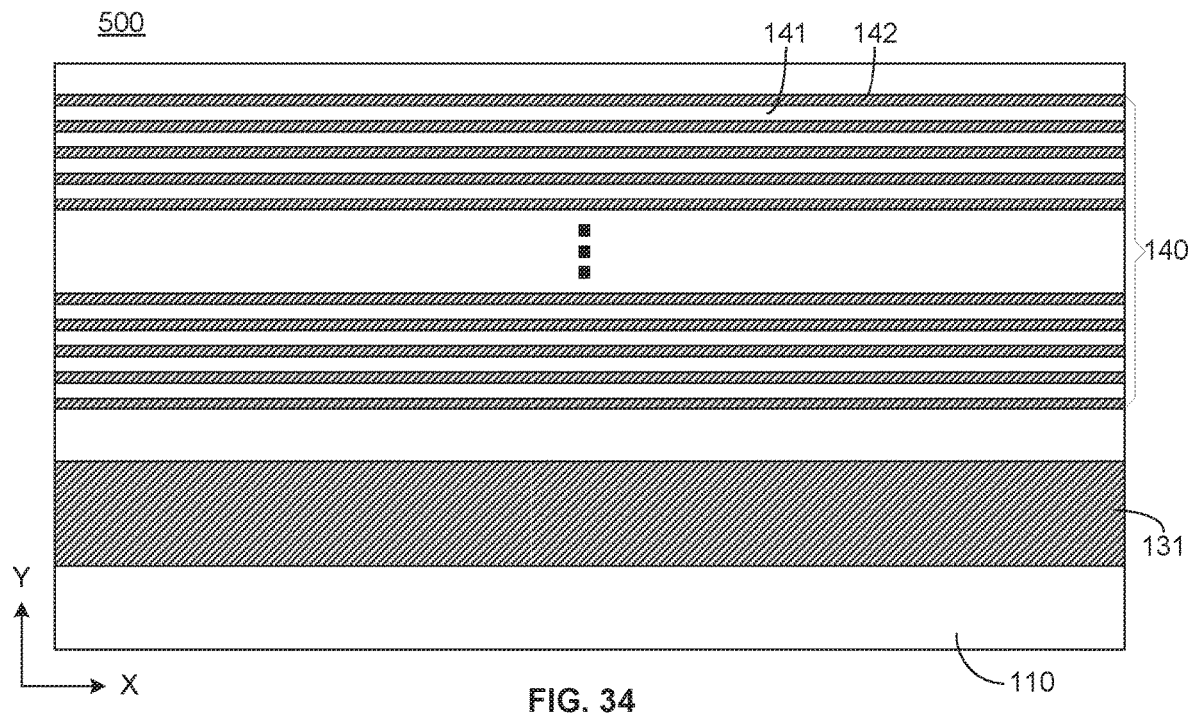
FIGS. 34-41 illustrate schematically cross-sectional views of another 3D memory device after several fabrication steps according to embodiments of the present disclosure.

Referring to FIG. 34, when the 3D memory device 500 is fabricated, a sacrificial layer 131 is deposited over the substrate 110 without first depositing a cover layer. The sacrificial layer 131 may include a material, such as a dielectric material, a semiconductive material, or a conductive material, that has a high etch selectivity with respect to the material of the substrate 110. In the description below, as an example, the layer 131 is a silicon nitride layer. Next, like in the device 100, the layer stack 140 including alternating stack layers 141 and 142 are deposited over the sacrificial layer 131. Like in the device 100, the stack layers 141 and 142 in the device 500 may exemplarily include silicon oxide and silicon nitride, respectively.

Figure 35:
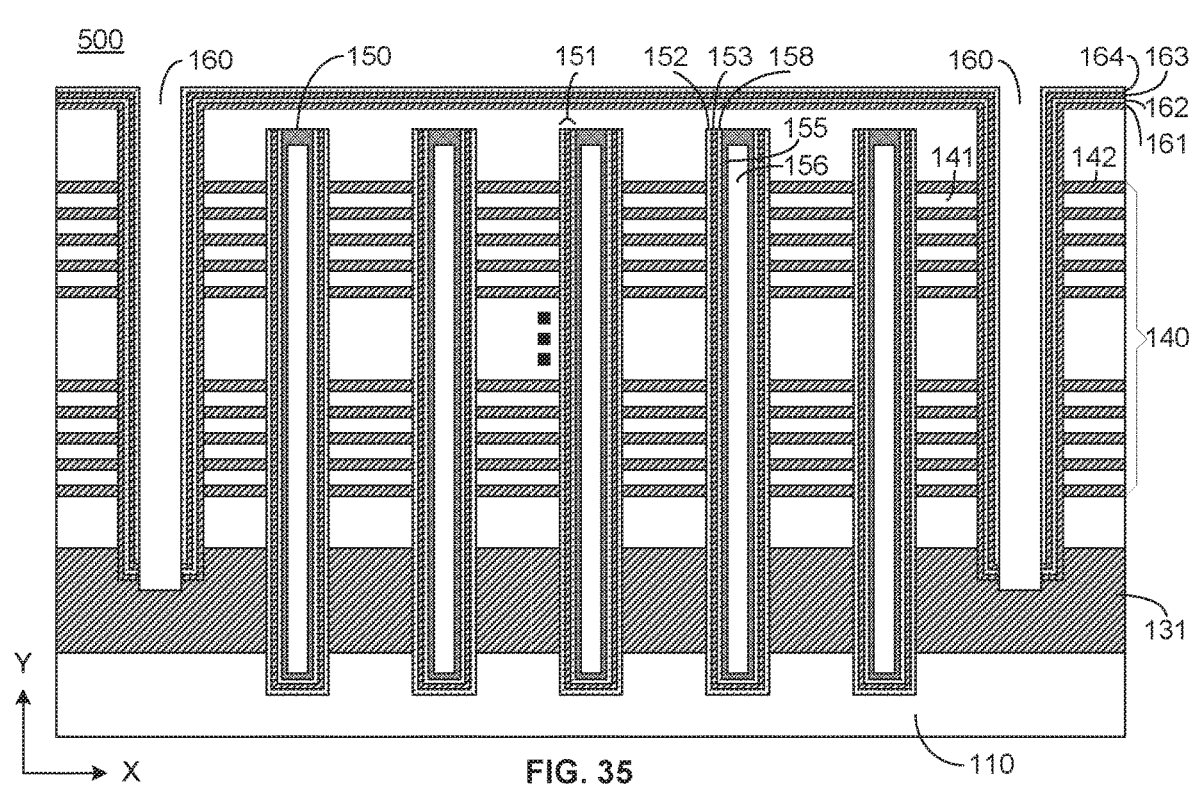

Referring to FIG. 35, like in the device 100, the channel holes 150, the functional layers 151, and the polysilicon channel layers 155 (semiconductor channels) are formed sequentially in the device 500. The functional layers 151 are formed on the sidewalls of the channel holes 150 in a same or similar manner as that for the device 100. The functional layer 151 in the device 500 includes the blocking layer 152 deposited on the sidewall of the channel hole 150, the storage layer 153 deposited on a surface of the blocking layer 152, and a tunnel insulation layer 158 deposited on a surface of the storage layer 153. The blocking layer 152 can include, e.g., a silicon oxide layer, and the storage layer 153 can include a silicon nitride layer. Different from the tunnel insulation layer 154 in the example devices described that includes a silicon oxide layer, the tunnel insulation layer 158 in the device 500 includes, for example, an aluminum oxide layer. Then, the polysilicon channel layer 155 is deposited on a surface of the tunnel insulation layer 158. The channel hole 150 may be filled with the dielectric material 156.

As shown in FIG. 35, the GLS 160 is formed and GLS spacers are deposited. The GLS spacers of the device 500 may, for example, include four layers instead of five layers in the device 100. The device 500 may include the same layers 161, 162, 163, and 164 as those in the device 100, but not the layer 165. For example, the layers 161 and 163 are silicon nitride and the layers 162 and 164 are silicon oxide. The bottom portions of the layers 161-164 in the GSL 160 are removed by a first etch process, such as a dry etch or a combination of dry and wet etch processes, which exposes the layer 131.

Figure 36:
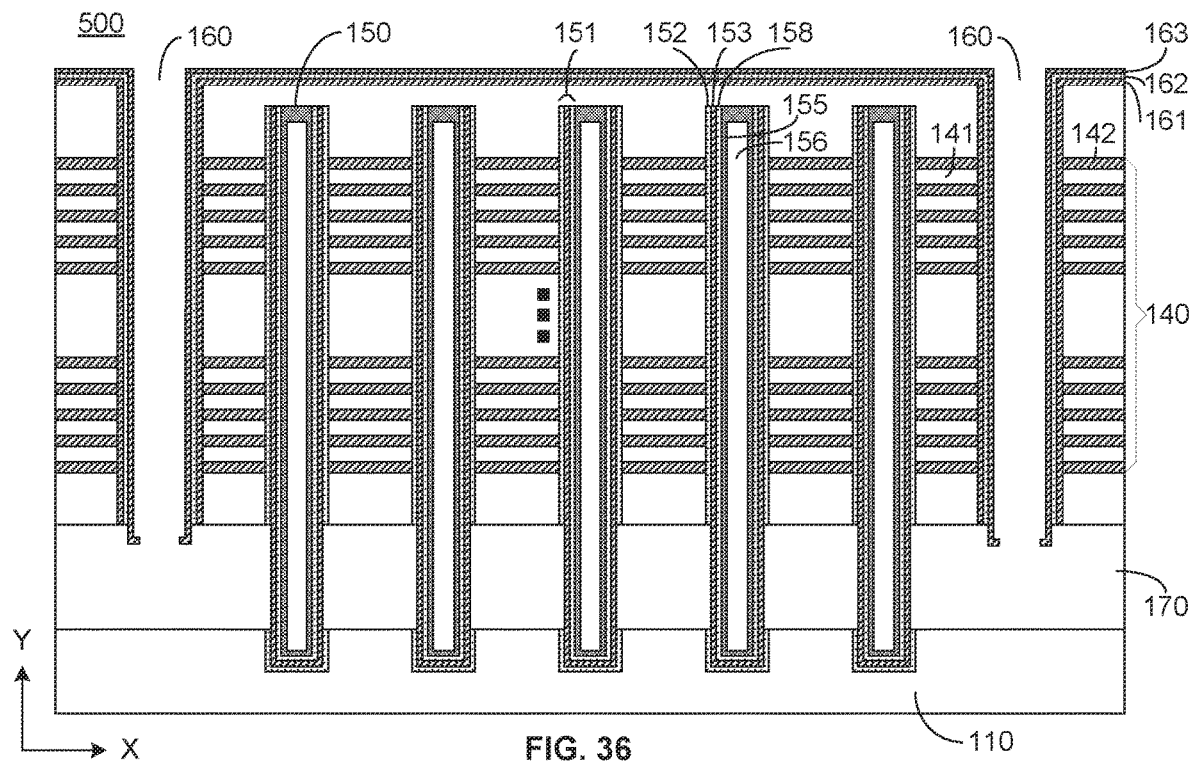

After the layer 131 is exposed, a second etch process, which may, for example, include two selective wet etch processes, is performed to etch silicon nitride materials and silicon oxide materials sequentially. As a result, the silicon nitride sacrificial layer 131 and the silicon oxide layer 164 are etched away and the cavity 170 is formed, as shown in FIG. 36. Removal of the sacrificial layer 131 exposes portions of the blocking layer 152 in the cavity 170. As the blocking layer 152 is also silicon oxide, the exposed portions of the layers 152 in the cavity 170 are also etched away in the second etch process.

Figure 37:
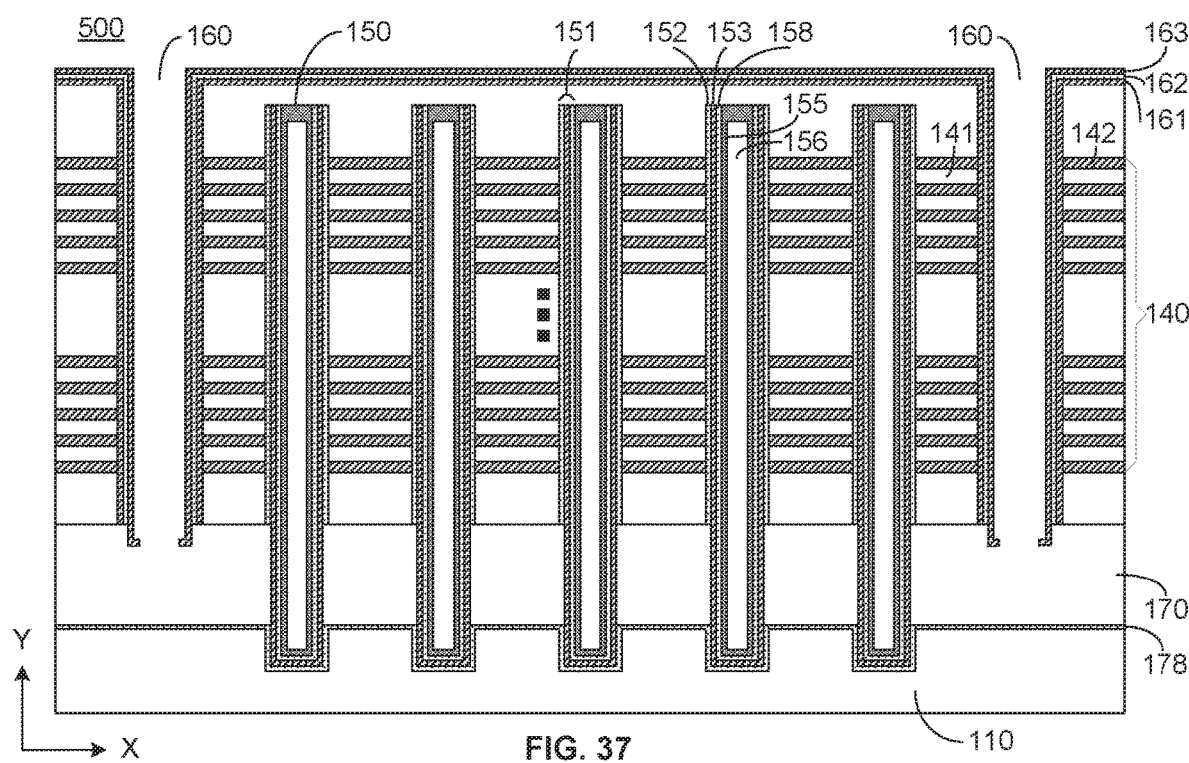

As shown in FIG. 36, removal of the sacrificial layer 131 exposes the top surface of the substrate 110. Next, an oxidation process is performed to grow a silicon oxide layer 178 over the substrate 110, as shown in FIG. 37. The silicon oxide layer 178 is configured as the cover layer.

Figure 38:
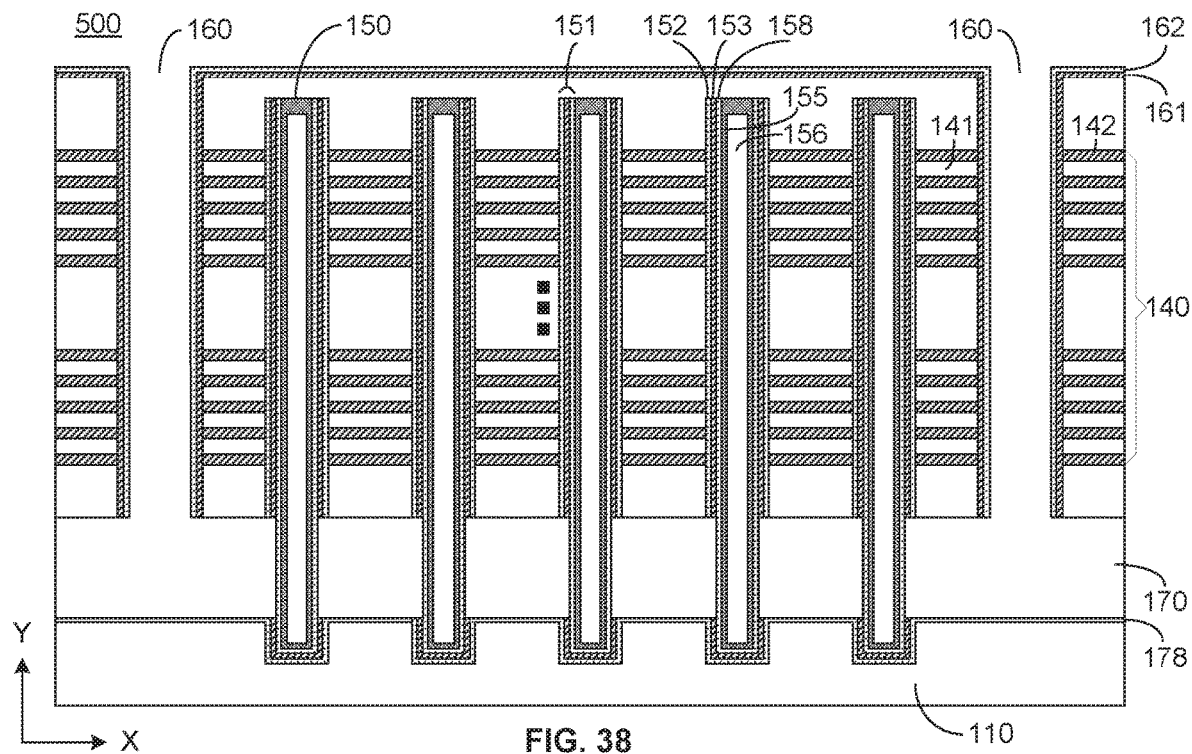
Figure 39:
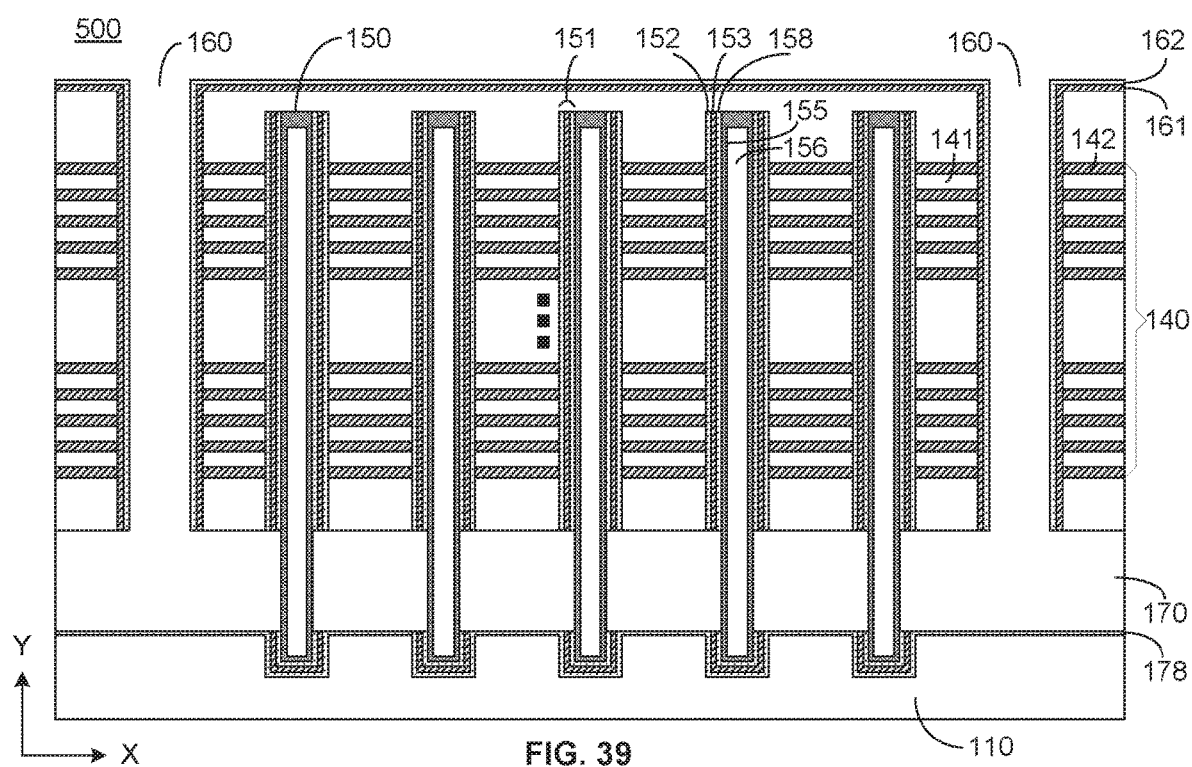

After the oxidation process, a third etch process, e.g., a selective wet etch process, is performed to etch silicon nitride materials. The layer 163 and exposed portions of the storage layers 153 in the cavity 170 are etched away. As a result, portions of the tunnel insulation layer 158, i.e., portions of the aluminum oxide layers, are exposed in the cavity 170, as shown in FIG. 38. Next, a fourth etch process, e.g., a selective wet etch process, is performed to etch away the aluminum oxide materials. As a result, as shown in FIG. 39, portions of the polysilicon channel layers 155 (the polysilicon sidewalls) in the cavity 170 are exposed after the fourth etch process, while the substrate 110 is still covered by the cover layer 178 at the bottom of the cavity 170.

Figure 40:
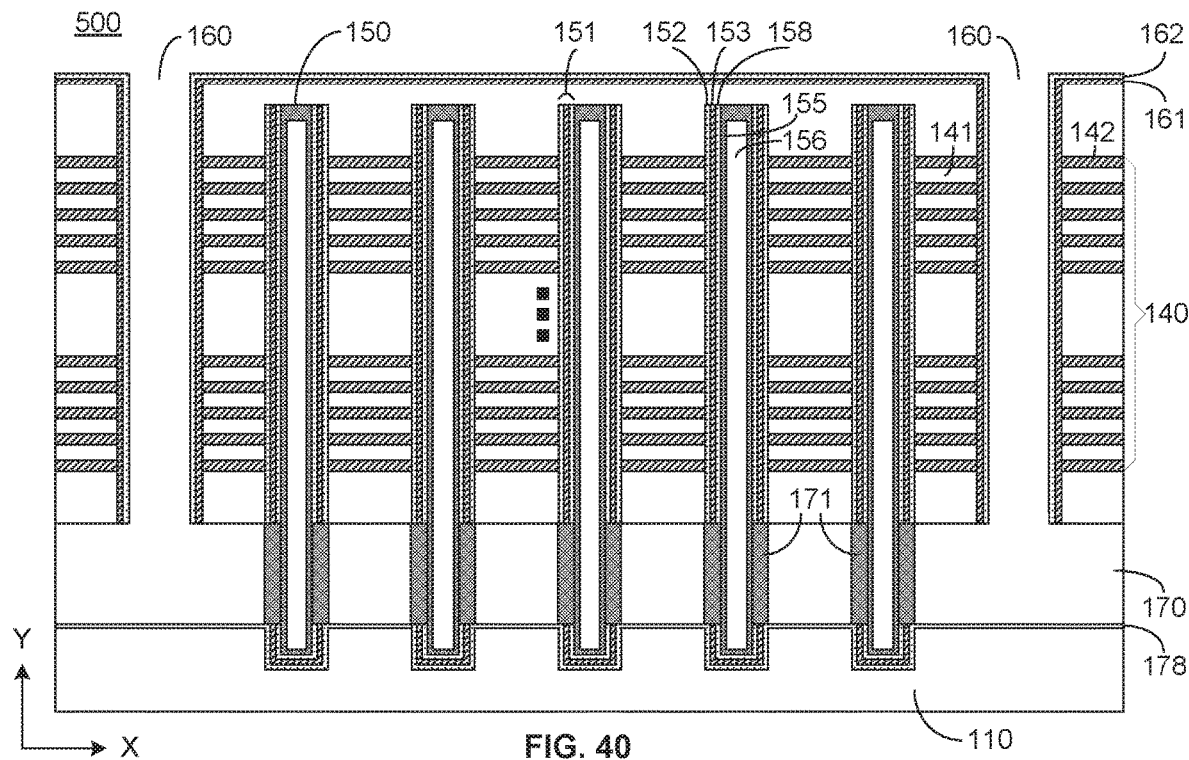

Thereafter, like in the fabrication processes for the device 100, a first selective epitaxial growth may be performed to only grow a polysilicon layer 171 on the polysilicon sidewalls in the cavity 170, as shown in FIG. 40. Then the silicon oxide cover layer 178 is etched out in a fifth etch process, e.g., a selective wet etch process. The top surface of the substrate 110 becomes exposed after the fifth etch processes. In some embodiments, the layer 178 is configured sufficiently thinner than the layer 162. As such, after the fifth etch process, the layer 162 may be partially etched. The remaining part of the layer 162 may form a layer 1621.

Figure 41:
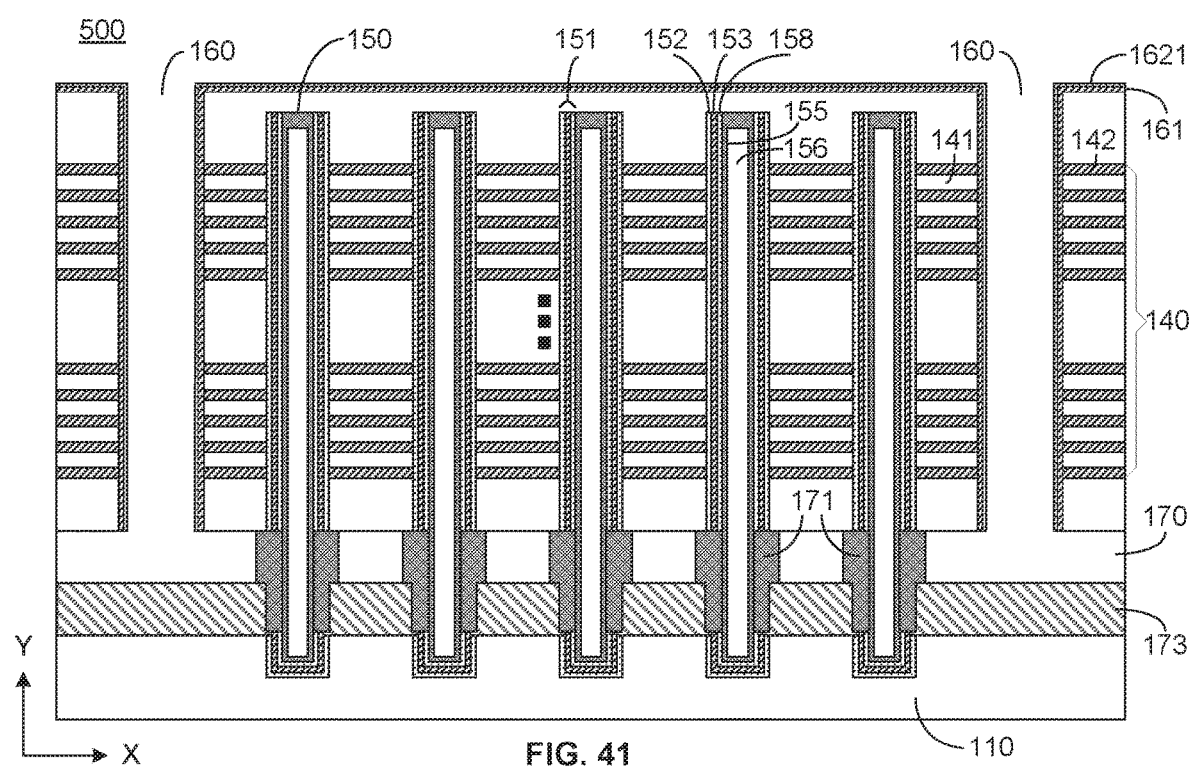

Like in the devices 100 and 200, a second selective epitaxial growth is performed to thicken the polysilicon layer 171 on the polysilicon sidewalls in the cavity 170 and simultaneously grow a single crystalline silicon layer 173 on the substrate 110, as shown in FIG. 41. Like in the devices 100 and 200, the layers 171 and 173 of the device 500 may be doped with p-type or n-type dopants. The layers 171 and 173 adjoin each other in regions close to the channel layers 155 and become electrically coupled.

As such, the layer 171 is grown by two subsequent processes of selective epitaxial growth. In comparison, the layer 173 is formed in only one selective epitaxial growth. After the second selective epitaxial growth, like in the devices 100 and 200, an oxidation process is performed to form oxide layers on the exposed surfaces of the layers 171 and 173. Then a sixth etch process, e.g., a selective wet etch process, is performed to remove the silicon oxide layer 1621 and the silicon nitride layers 161 and 142. Cavities left by the layers 142 are filled by metal such as W to form conductor layers. The conductor layers are configured as the word lines of the 3D memory device 500 and the channel layers 155 (the semiconductor channels) are configured as the bit lines. Like in the device 100, silicon oxide deposition and etch processes are used to expose the layer 173 at the bottom of the GLS 160 and electrically conductive materials are deposited to form the ACS. After that, other fabrication steps or processes are performed to complete fabrication of the device 500.

Although the principles and implementations of the present disclosure are described by using specific embodiments in the specification, the foregoing descriptions of the embodiments are only intended to help understand the present disclosure. In addition, features of aforementioned different embodiments may be combined to form additional embodiments. A person of ordinary skill in the art may make modifications to the specific implementations and application range according to the idea of the present disclosure. Hence, the content of the specification should not be construed as a limitation to the present disclosure.

What is claimed is:

1. A method for fabricating a three-dimensional (3D) memory device, comprising:
   depositing a cover layer over a substrate;
   depositing a sacrificial layer over the cover layer;
   depositing a layer stack over the sacrificial layer;
   forming a channel layer extending through the layer stack and the sacrificial layer;
   performing a first epitaxial growth after a removal of the sacrificial layer to deposit a first epitaxial layer on a side portion of the channel layer that is close to the substrate;
   removing the cover layer; and
   performing a second epitaxial growth to simultaneously thicken the first epitaxial layer and deposit a second epitaxial layer on the substrate, providing a cavity between the layer stack and the second epitaxial layer over the substrate.

2. The method according to claim 1, further comprising:
   before forming the channel layer, forming a functional layer extending through the layer stack and the sacrificial layer,
   wherein forming the channel layer includes forming the channel layer adjacent to the functional layer.

3. The method according to claim 2, wherein forming the functional layer includes:
   forming a channel hole through the layer stack and the sacrificial layer;
   forming a blocking layer on a side wall of the channel hole;
   forming a storage layer on the blocking layer; and
   forming a tunnel insulation layer on the storage layer.

4. The method according to claim 2, further comprising, before performing the first epitaxial growth:
   removing a portion of the functional layer that is close to the substrate to expose the side portion of the channel layer.

5. The method according to claim 1, wherein:
   the layer stack including a plurality of first stack layers and a plurality of second stack layers alternately stacked in a direction approximately perpendicular to the substrate, the method further comprising:
   removing the plurality of first stack layers.

6. The method according to claim 5, further comprising:
   forming a plurality of conductor layers, the plurality of conductor layers and the plurality of second stack layers being alternately stacked in the direction approximately perpendicular to the substrate.

7. The method according to claim 1, further comprising:
   forming a gate line slit (GLS) extending through the layer stack; and
   filling the GLS with a conductive material to form a conductive layer that electrically connects with the second epitaxial layer.

8. The method according to claim 1, wherein:
   the cavity further exposes a thickened portion of the first epitaxial layer between the layer stack and the second epitaxial layer.

9. A method for fabricating a three-dimensional (3D) memory device, comprising:
   depositing a sacrificial layer over a substrate;
   depositing a layer stack over the sacrificial layer;
   forming a channel layer extending through the layer stack and the sacrificial layer;

forming a cover layer to shield the substrate, after a removal of the sacrificial layer;
performing a first epitaxial growth to deposit a first epitaxial layer on a side portion of the channel layer that is close to the substrate;
removing the cover layer; and
performing a second epitaxial growth to simultaneously thicken the first epitaxial layer and deposit a second epitaxial layer on the substrate, providing a cavity between the layer stack and the second epitaxial layer over the substrate.

10. The method according to claim 9, further comprising:
before forming the channel layer, forming a functional layer extending through the layer stack and the sacrificial layer,
wherein forming the channel layer includes forming the channel layer adjacent to the functional layer.

11. The method according to claim 10, wherein forming the functional layer includes:
forming a channel hole through the layer stack and the sacrificial layer;
forming a blocking layer on a side wall of the channel hole;
forming a storage layer on the blocking layer; and
forming a tunnel insulation layer on the storage layer.

12. The method according to claim 11, further comprising, before performing the first epitaxial growth:
removing a portion of the blocking layer that is close to the substrate to expose a portion of the storage layer;
removing the portion of the storage layer to expose a portion of the tunnel insulation layer; and
removing the portion of the tunnel insulation layer to expose the side portion of the channel layer.

13. The method according to claim 9, wherein:
the layer stack including a plurality of first stack layers and a plurality of second stack layers alternately stacked in a direction approximately perpendicular to the substrate, the method further comprising:
removing the plurality of first stack layers.

14. The method according to claim 13, further comprising:
forming a plurality of conductor layers, the plurality of conductor layers and the plurality of second stack layers being alternately stacked in the direction approximately perpendicular to the substrate.

15. The method according to claim 9, further comprising:
forming a gate line slit (GLS) extending through the layer stack; and
filling the GLS with a conductive material to form a conductive layer that electrically connects with the second epitaxial layer.

* * * * *